US 7,242,424 B2

(12) United States Patent
Lee

(10) Patent No.: US 7,242,424 B2
(45) Date of Patent: Jul. 10, 2007

(54) DIGITAL TV RECEIVING SMART ANTENNA CONTROL SYSTEM AND CONTROLLING METHOD OF THE SAME

(75) Inventor: Tae Won Lee, Gyeonggi-do (KR)

(73) Assignee: LG Electronics, Inc., Seoul (KR)

( * ) Notice: Subject to any disclaimer, the term of this patent is extended or adjusted under 35 U.S.C. 154(b) by 502 days.

(21) Appl. No.: 10/804,406

(22) Filed: Mar. 18, 2004

(65) Prior Publication Data

US 2004/0183911 A1 Sep. 23, 2004

(30) Foreign Application Priority Data

Mar. 19, 2003 (KR) ................... 10-2003-0017197

(51) Int. Cl.
*H04N 5/00* (2006.01)

(52) U.S. Cl. .................. 348/180; 455/277.2

(58) Field of Classification Search ............ 348/614, 348/607, 21, 725, 726, 729, 706, 611, 731; 375/321, 353; 342/372; 455/277.2, 135
See application file for complete search history.

(56) References Cited

U.S. PATENT DOCUMENTS

| | | | | |
|---|---|---|---|---|
| 5,748,226 A | * | 5/1998 | Limberg | 348/21 |
| 5,771,015 A | * | 6/1998 | Kirtman et al. | 342/359 |
| 5,801,759 A | * | 9/1998 | Limberg | 348/21 |
| 5,835,131 A | * | 11/1998 | Limberg | 348/21 |
| 5,995,135 A | * | 11/1999 | Limberg | 348/21 |
| 6,005,894 A | * | 12/1999 | Kumar | 375/270 |
| 6,111,542 A | * | 8/2000 | Day et al. | 342/359 |
| 6,351,500 B2 | * | 2/2002 | Kumar | 375/270 |
| 6,950,477 B2 | * | 9/2005 | Meehan et al. | 375/267 |
| 7,006,040 B2 | * | 2/2006 | Henderson et al. | 342/372 |
| 7,034,893 B2 | * | 4/2006 | Liu et al. | 348/614 |

FOREIGN PATENT DOCUMENTS

KR 1020020024844 A 4/2002

* cited by examiner

*Primary Examiner*—Paulos Natnael
(74) *Attorney, Agent, or Firm*—Lee, Hong, Degerman, Kang & Schmadeka

(57) ABSTRACT

Disclosed is a digital TV smart antenna system and controlling method of the same, the system converges a smart antenna into an optimal reception by detecting a maximum signal power in a signal acquisition process for a fast acquisition performance and selectively assembling information such as signal power, multi-channel, SNR, and SER, and particularly, calculates signal power according to the antenna direction by fixing AGC as a specific value for detecting the maximum signal power.

33 Claims, 18 Drawing Sheets

To be continued
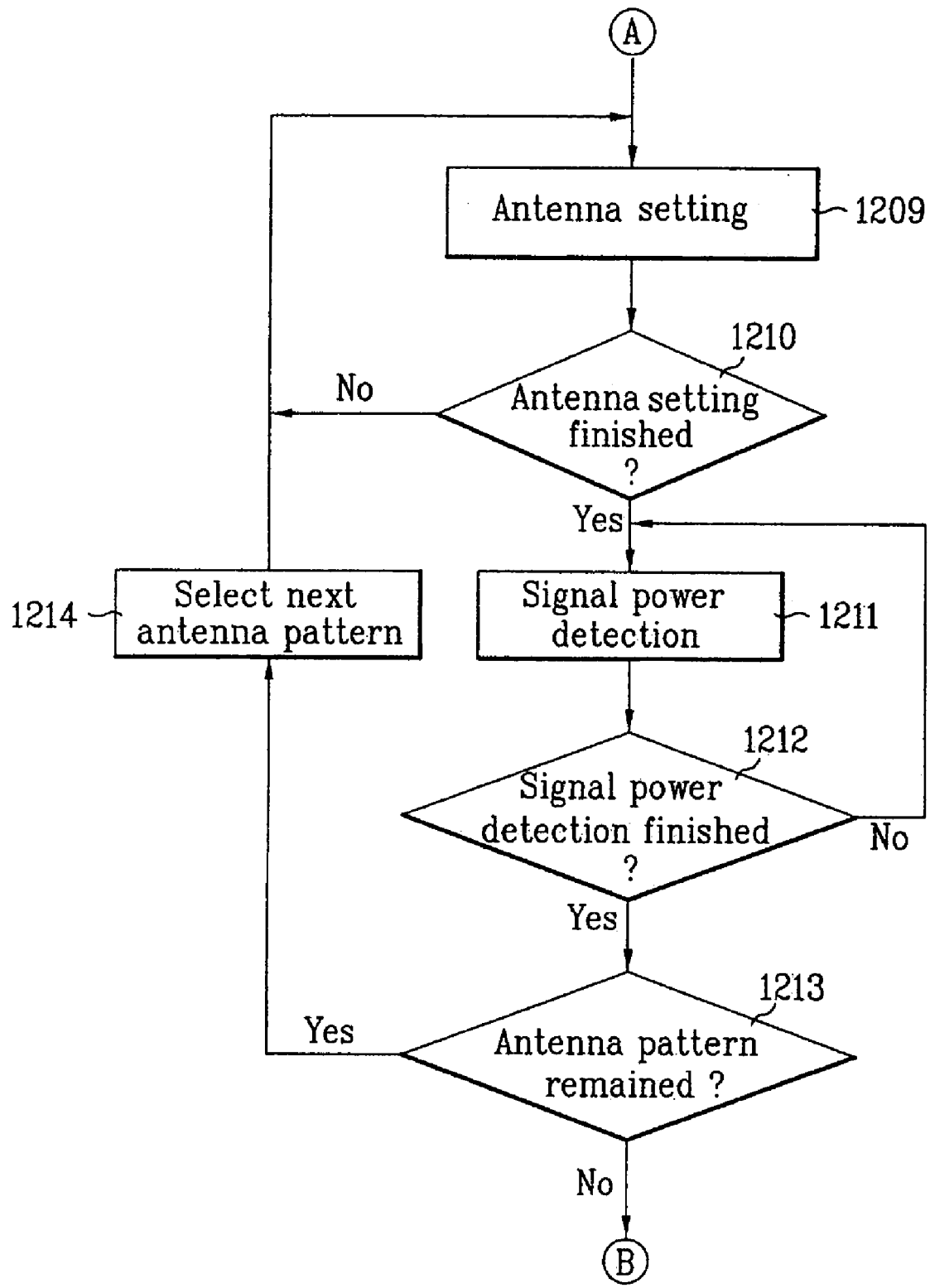

To be continued
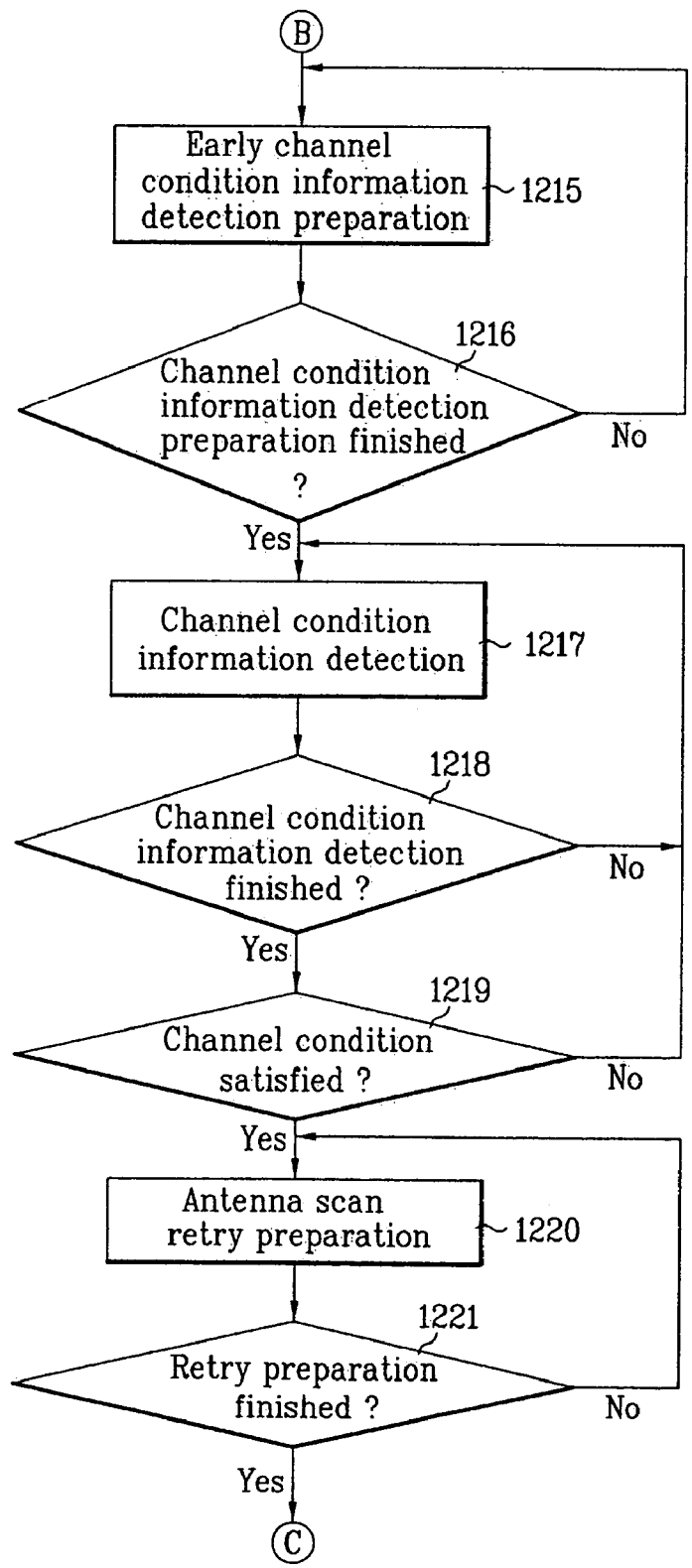

DIGITAL TV RECEIVING SMART ANTENNA CONTROL SYSTEM AND CONTROLLING METHOD OF THE SAME

CROSS-REFERENCE TO RELATED APPLICATIONS

This application claims the benefit of Korean Application No. P2003-17197, filed on Mar. 19, 2003, which is hereby incorporated by reference as if fully set forth herein.

BACKGROUND OF THE INVENTION

1. Field of the Invention

The present invention relates to a digital TV, and more particularly, to a digital TV receiving smart antenna control system and a controlling method of the same.

2. Discussion of the Related Art

Research about an antenna of a VSB (Vestigial Side Band) receiver is insufficient yet because it is an early stage, the antenna of the VSB receiver selected as a standard transmitting method of terrestrial broadcasting channel of a digital TV.

However, in recent years, a concept and an idea about the antenna are actively proposed. It is known that an ATSC (Advanced Television Systems Committee) completed a standardization (CEA/EIA909) of the antenna.

An ATI (Next Wave) company experimentally applied the antenna to a real digital TV and currently a field test is ongoing. In other words, a TV market is at a beginning stage and technology of the digital TV receiving antenna is also at the early stage.

There is technology of antenna applied to a radio telecommunication system (For example, a cellular phone, military wireless communication) in a related art. However, the technology is very complex and expensive. Therefore, more technical efforts are needed for applying the technology to the digital TV.

SUMMARY OF THE INVENTION

Accordingly, the present invention is directed to a digital TV receiving smart antenna control system and a controlling method of the same that substantially obviates one or more problems due to limitations and disadvantages of the related art.

An object of the present invention is to provide a digital TV receiving smart antenna control system and a controlling method of the same for improving a receiving performance of a receiver in a terrestrial channel in poor and kaleidoscope surroundings by applying a smart antenna and an antenna control system to a digital TV receiver Another object of the present invention is to provide a digital TV receiving smart antenna control system and a controlling method of the same for improving quality of a receiving signal by removing multi-channel at an indoor reception and improving the quality of the signal through applying the smart antenna to a digital TV, and for providing an excellent performance to transmitting towers at different locations.

Another object of the present invention is to provide a digital TV receiving smart antenna control system and a controlling method of the same for detecting a maximum signal power direction at a high speed by detecting signal power at the high speed when a gain of the receiver in antenna control information is fixed at a predetermined level for an indoor reception, and by performing a 360° antenna scan by using the signal power.

A further object of the present invention is to provide a digital TV receiving smart antenna control system and a controlling method of the same for providing an optimal receiving signal to a digital TV receiver by converging an optimal antenna direction by using an antenna direction tracing loop.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a digital TV receiving smart antenna control system includes a smart antenna system for forming an antenna pattern suitable for signal reception by receiving mechanical or electrical antenna control signal and controlling a beam width, gain, and frequency characteristic, a VSB demodulator for generating channel data for demodulating a VSB (Vestigial Side Band) signal received through the smart antenna system, generating channel data for the antenna pattern, and outputting the demodulated VSB signal in a transport packet form, and an antenna controller for receiving the channel data and auto gain control information from the VSB demodulator and controlling the smart antenna system by using the auto gain control information and the channel information set as a specific value.

In another aspect of the present invention, a digital TV receiving smart antenna control system includes the smart antenna system for forming an antenna pattern suitable for signal reception by receiving mechanical or electrical antenna control signal and controlling a beam width, gain, and frequency characteristic, a tuner for tuning only a specific RF signal in RF (Radio Frequency) signal received through a smart antenna system, and converting the signal into an IF signal after automatically controlling RF gain tuned according to RF gain control signal, a VSB (Vestigial Side Band) demodulator for demodulating after controlling the IF (Intermediate Frequency) signal gain according to IF gain control signal, a channel information detector for detecting channel information such as signal power, multi-channel signal power, SNR (signal-to-noise ratio), and SER (Segment Error Rate) outputted from the VSB demodulator, determining the channel condition and outputting the channel information and the channel conditions, and an antenna direction acquisition controller for receiving signal power condition, multi-channel signal power condition, SNR condition, SER condition, and signal power information form the channel information detector and detecting and outputting an antenna direction of the maximum signal power, fixing the RF gain control signal and IF gain control signal in acquisition process, and changing the signals according to the receiving signal in a tracking process.

Meanwhile, a controlling method of a digital TV receiving smart antenna control system includes the steps of acquiring maximum signal power according to the antenna direction by using signal power information, multi-channel information, SNR information, and SER information extracted from an input signal, and converging the smart antenna into an optimal reception by selectively assembling the signal power information, the multi-channel information, the SNR information, and the SER information.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

In the present invention, a receiving performance of a receiver is improved in a terrestrial channel in poor and kaleidoscope surroundings by applying a smart antenna and an antenna control system to a digital TV receiver. In other words, by optimizing the antenna system, reliability of the receiver is improved.

The present invention has a characteristic of coping with an environment wherein a transmitting tower exists at different locations according to a broadcasting channel. In fact, this is a matter of a frequent occurrence in other countries.

In general, because the digital TV receiver requires a limited stable time, and a signal power detecting time takes up a long time in an antenna control process, the signal power detecting time is an important factor influencing an acquisition performance of the system.

A general early acquisition time of a smart antenna is objected to be less than one minute. To satisfy the limitation, a fast antenna direction acquisition performance is needed, which is an important performance factor of the smart antenna.

Together with this, the digital TV receiver detects a SNR (signal-to-noise ratio), multi-channel signal information, SER (segment error rate) for understanding quality of a receiving signal, and it takes a long time to detect the SNR, multi-channel signal information, and SER.

Therefore, for fast acquisition performance, maximum signal power is detected in a signal acquisition process and the smart antenna is converged by selectively detecting signal power, multi-channel, SNR, and SER in a tracking process. Particularly, for detecting the maximum power, the AGC (auto gain controller) is fixed at a predetermined value and calculates signal power according to an antenna direction. In the tracking process, by continuously detecting channel information, the smart antenna is controlled corresponding to a channel environment changing every hour.

Figure 1:
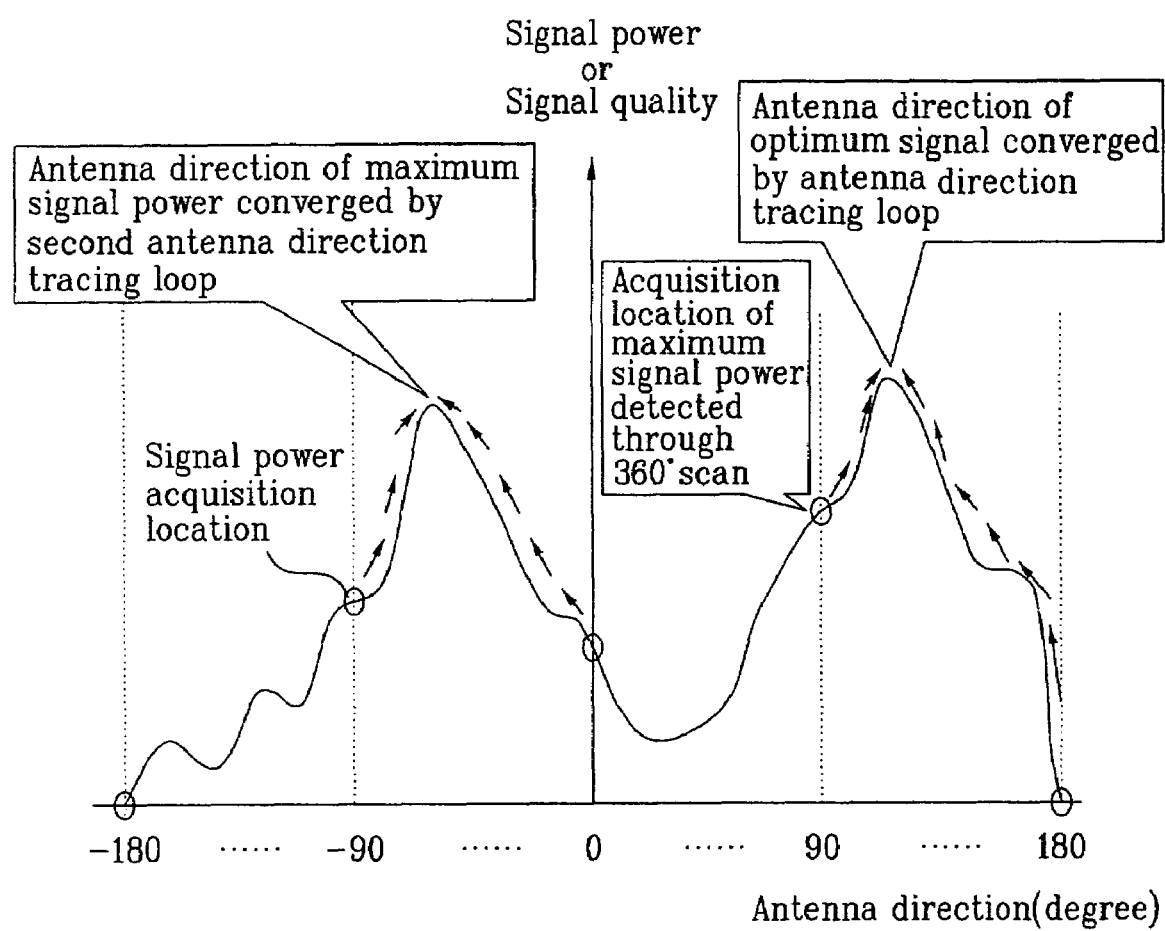
FIG. 1 illustrates a diagram showing a basic algorithm of a digital TV receiving smart antenna control system in accordance with the present invention.

Hereinafter, the digital TV receiving antenna control system and the controlling method of the same will be described in reference to appended drawings. FIG. 1 illustrates a conceptual diagram showing a basic algorithm of a digital TV receiving smart antenna control system in accordance with the present invention.

As illustrated in FIG. 1, a basic concept of the antenna control algorithm of the control system is that an optimal antenna direction is determined by acquiring the signal power at a predetermined degree (for example, −180°, −90°, 0°, 90°, 180°) through 360° scanning of the smart antenna and by acquiring a maximum signal power location through converging the signal power to the antenna direction tracking loop in a predetermined degree unit.

Figure 2:
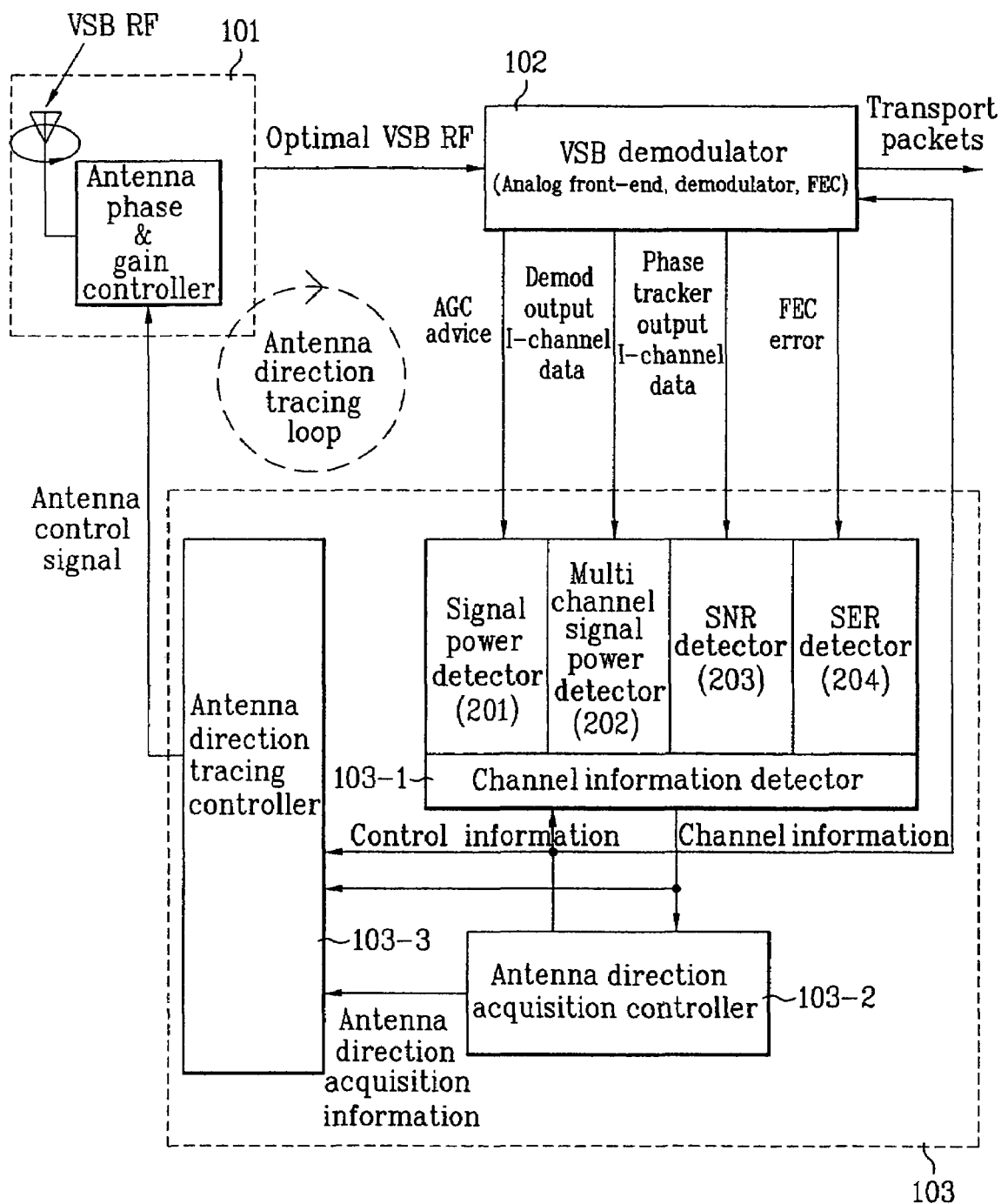
FIG. 2 illustrates a block diagram showing a digital TV receiving smart antenna control system in accordance with the present invention.

FIG. 2 illustrates a block diagram of a digital TV receiving smart antenna control system including a smart antenna system 101, a VSB modulator 102, and an antenna controller 103. First, the smart antenna system 101 controls a beam width, a gain, a frequency characteristic by a mechanical or electrical antenna control signal of the antenna controller 103 for an optimal antenna pattern for a signal reception.

The VSB modulator 102 includes an AGC, a symbol/carrier/sync recoverer, a channel equalizer, a channel decoder (for example, FEC: forward error correction) and modulates the VSB signal received through the smart antenna system 101 for outputting in a transport packet form. In this case, the AGC method of the digital TV receiver is the same as illustrated in FIG. 3 and FIG. 4.

Figure 3:
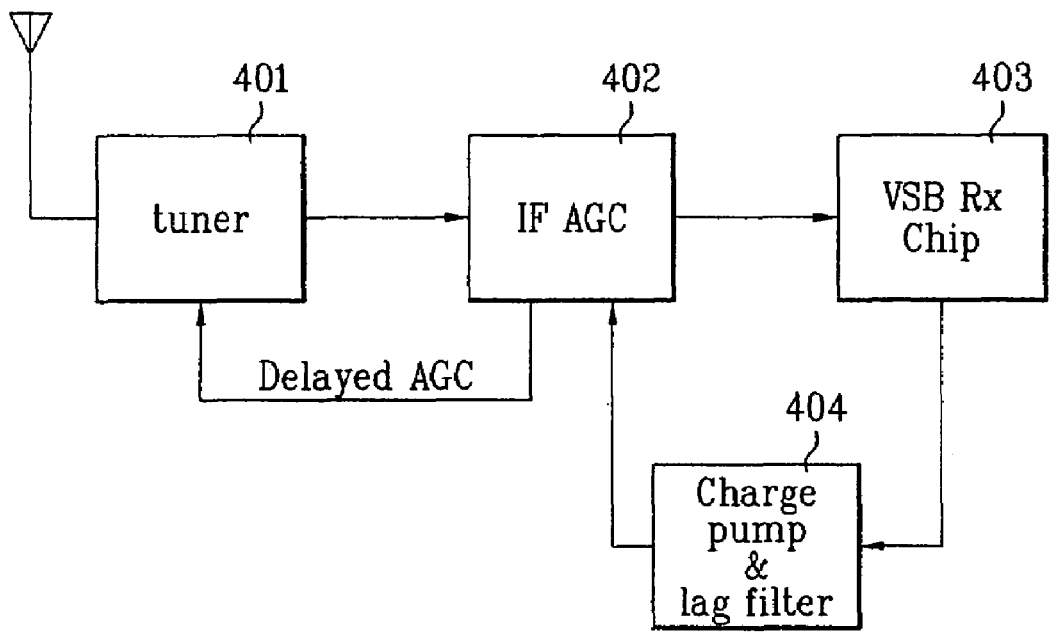
FIG. 3 illustrates a block diagram showing a first embodiment of an auto gain controller of a VSB demodulator of FIG. 2.
Figure 4:
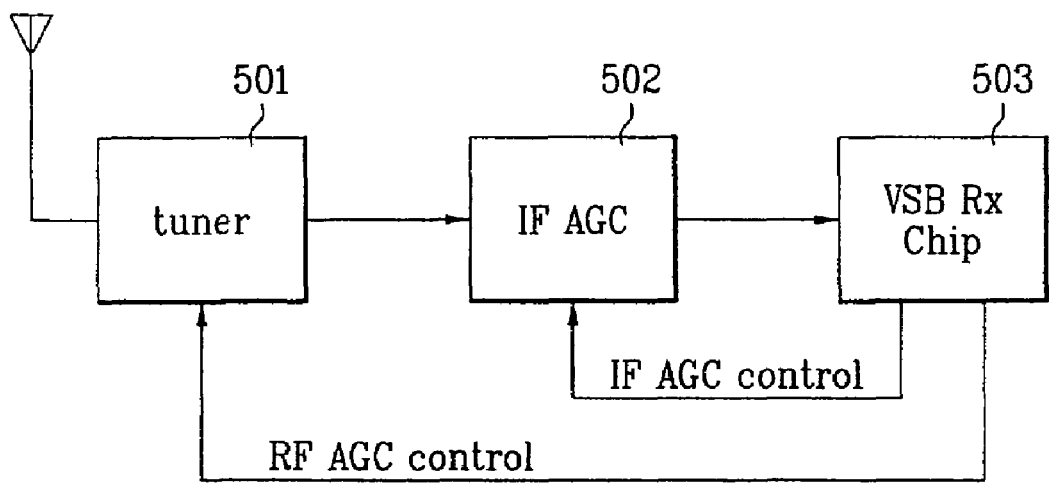
FIG. 4 illustrates a block diagram showing a second embodiment of an auto gain controller of a VSB demodulator of FIG. 2.

The AGC method illustrated in FIG. 3 is a method of removing gain of IF signal of IF (Intermediate frequency) AGC 402 through the charge pump and filter 404 at the VSB receiving chip and removing gain of RF (Radio frequency) signal of a tuner 401 by using a delayed AGC signal. In the AGC method illustrated in FIG. 4, the gains of the IF signal and the RF signal are directly removed at the VSB receiving chip 503.

In other words, the AGC method for directly removing the gains of the IF signal and the RF signal includes the steps of generating IF AGC control signal and RF AGC control signal by using a passband or baseband receiving signal modulated with the RF AGC reference value at the VSB receiving chip 503, and outputting each signal to IF AGC 502 and a tuner 01.

The IF AGC 502 changes the gain of the IF signal into a desired state by increasing or decreasing the gain of IF signal according to the IF AGC control signal inputted from the IF AGC 502 and the tuner 501 changes the gain of the RF signal by increasing or decreasing the gain of the RF signal according to the RF AGC control signal.

Meanwhile, the antenna controller 103 controlling the smart antenna system 101 mechanically or electronically through the channel data includes a channel information detector 103-1, an antenna direction acquisition controller 103-2, and an antenna direction tracking controller 103-3.

1) Channel Information Detector:

The channel information detector 103-1 detects channel data (for example, AGC information, modulated I channel data, phase tracked I channel data, FEC error data, Field sync signals), determines the channel condition, and outputs the detected channel information and the channel conditions to the antenna direction acquisition controller 103-2 and the antenna direction tracking controller 103-2.

Figure 5:
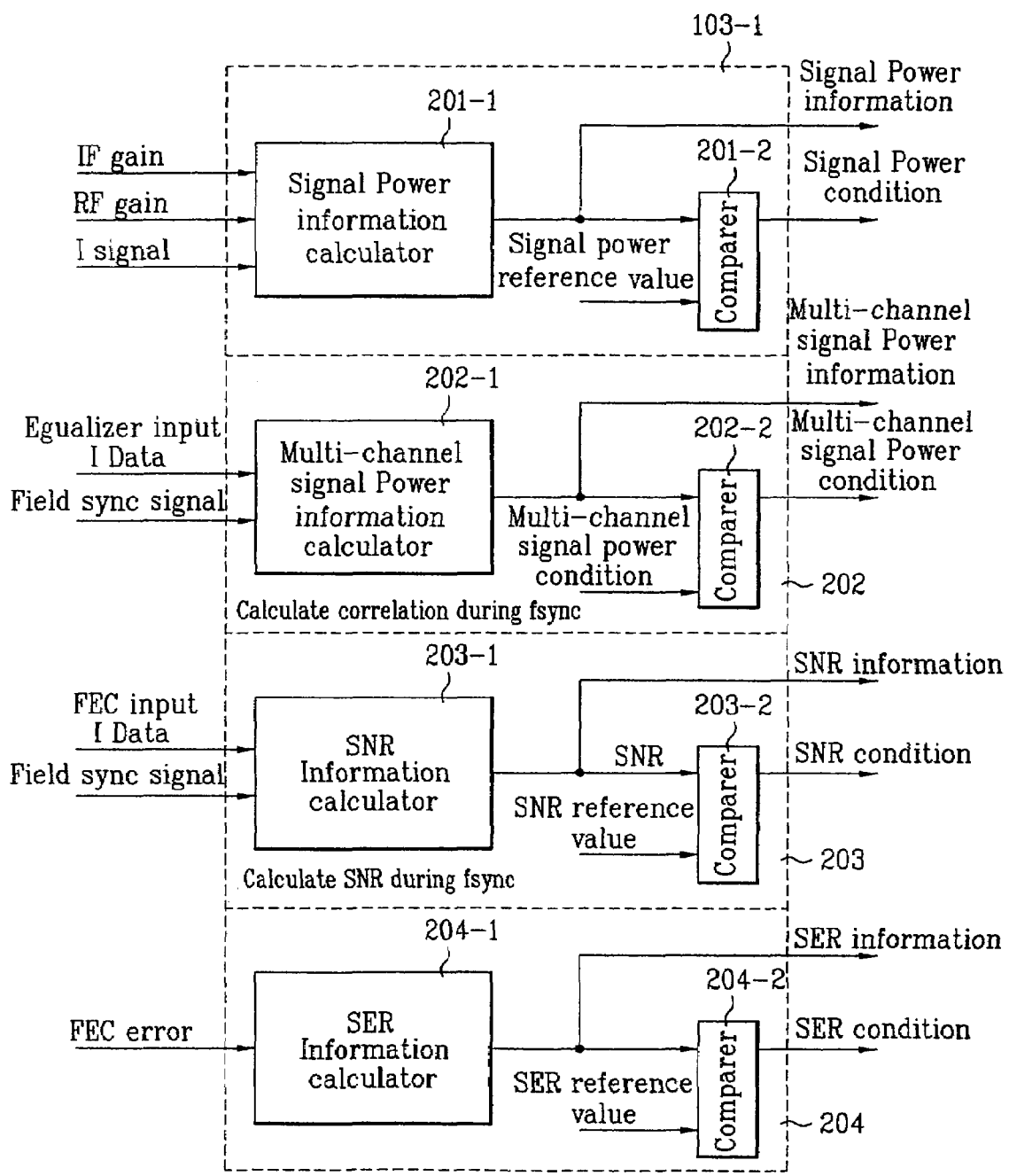
FIG. 5 illustrates a detailed block diagram showing a channel information detector of FIG. 2.

For this, the channel information detector 103-1, as illustrated in FIG. 5, includes a signal power detector 201 for outputting the signal power information and the power condition, a multi-channel signal power detector 203 for outputting the multi-channel signal power information and condition, a SNR detector 203 for outputting the SNR information and SNR condition, and a SER detector 204 for outputting the SER information and the SER condition.

The signal power detector 201 includes a signal power information calculator 201-1 for detecting the signal power information from the IF gain and the RF gain, and a comparer 201-2 for comparing the signal power information with a set signal power value and outputting the signal power condition.

The multi-channel signal power detector 202 includes a signal power information calculator 202-1 for detecting the multi-channel signal power information from the equalizer input I channel data outputted from the demodulator 102 or the field sync signal, and a comparer for comparing the multi-channel signal power information with the set multi-channel signal power reference value so as to output the multi-channel signal power condition.

The SNR detector 203 includes a SNR information calculator (203-1) for detecting the SNR information from the FEC input I channel data or the field sync signal, and a comparer 203-2 for comparing the SNR information with the set SNR reference value so as to output the SNR condition.

The SER detector 204 includes a SER information calculator 204-1 for detecting SER information from a FEC error value outputted from the demodulator 102, and a comparer 204-2 for comparing the SER information and the set SER reference value so as to output the SER condition.

Figure 6:
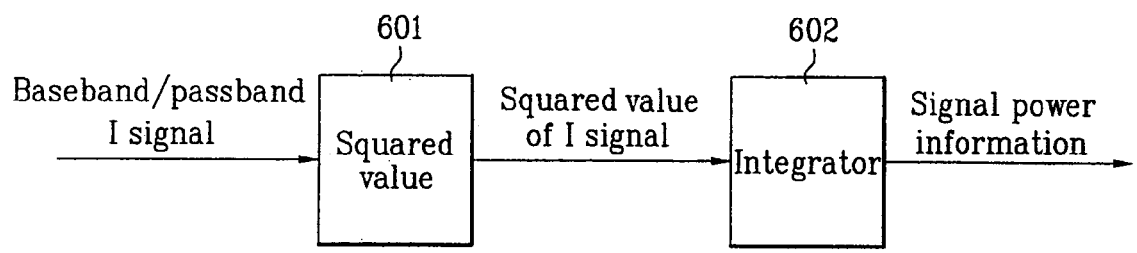
FIG. 6 illustrates a detailed block diagram showing a first embodiment of a signal power information calculator of FIG. 3.
Figure 7:
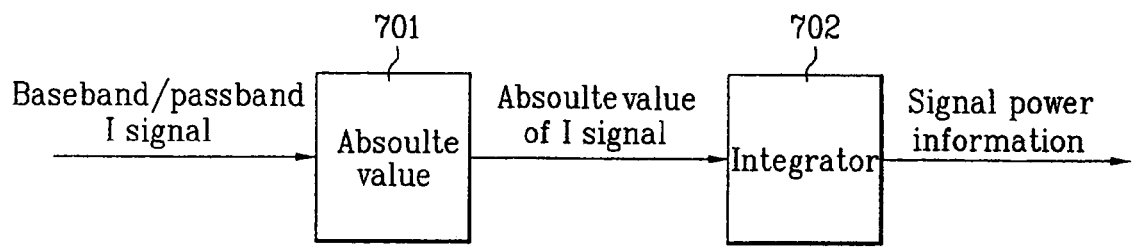
FIG. 7 illustrates a detailed block diagram showing a second embodiment of a signal power information calculator of FIG. 3.

In this case, in the smart antenna control system, as illustrated in FIG. 4, the auto gain controller is provided to the VSB demodulator 102 and gain control value (i.e., RG AGC control signal, IF AGC control signal) of the auto gain controller is set to a predetermined value in the antenna direction acquisition process, so as to detect the signal power by using the signal power detector illustrated in FIG. 6 or in FIG. 7.

In this instance, in the signal acquisition process of the antenna, a specific value for fixing the auto gain controller in FIG. 4 is obtained experimentally through an experiment. In the present invention, as an embodiment, the auto gain control value with the band power of the input RF signal about 60 dbm is used for fixing the gain controller.

Hereinafter, the signal power information calculator 201-1 included in the channel information detector 103-1, the multi-channel information calculator 202-1, the SNR information calculator 203-1, and the SER information calculator 204-1 are described in detail.

1-1) Signal Power Information Calculator:

The signal power information calculator 201-1 is realized in two methods as illustrated in FIG. 6 and FIG. 7. In a first method, the signal power information calculator 201-1 includes a squaring operator 601 for receiving a passband or baseband I signal from the VSB demodulator 102 for obtaining a squared value, and an integrator 602 for accumulating the squared value into a predetermined window size for detecting the signal power as illustrated in FIG. 6.

In other words, the squaring operator 601 receives the passband or baseband I signal from the VSB demodulator 102, obtains the squared value and outputs the value to the integrator 602. The integrator 602 accumulates the squared value into a predetermined size and divides the accumulated value into a window size and outputs the value. The output of the integrator 602 is the signal power information.

In a second method, the signal power calculator 201-1 detects the signal power information by using an absolute value operator 701 and an integrator 702 as illustrated in FIG. 7. In other words, the absolute value operator 701 receives the passband and baseband I signal from the VSB demodulator 102, obtains the absolute value, and outputs the value to the integrator 702. The integrator 702 accumulates the squared value into a predetermined size and divides the accumulated value into a window size and outputs the value as the signal power information.

In this instance, in the antenna direction acquisition process, the gain control value of the auto gain controller of FIG. 4 is fixed into a specific value and detects the signal power by using the signal power detector 201. And then, when the antenna direction acquisition process is finished and the antenna direction tracking process is started, the auto gain controller forms a loop for controlling the auto gain control amplifier and detects the signal power from the portion (integrator) storing the gain error in the loop.

Figure 8:
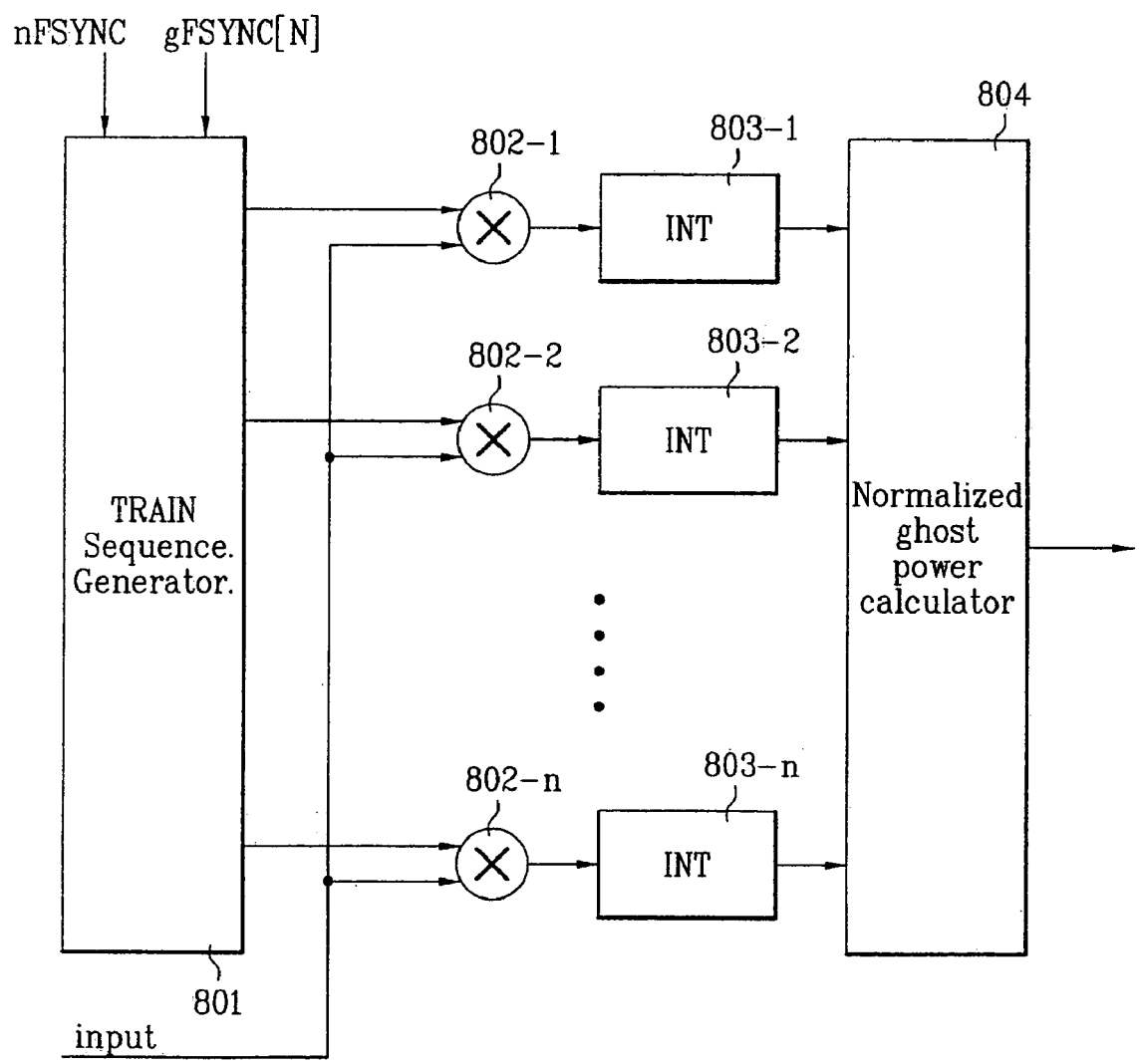
FIG. 8 illustrates a detailed block diagram showing a first embodiment of a multi-channel signal power calculator of FIG. 3.

1-2) Multi-Channel Signal Power Information Calculator:

The multi-channel signal power calculator 201-1 detects the multi-channel signal power information by using the field sync section as illustrated in FIG. 8. In other words, a degree of the ghost in contradiction to a main signal is calculated.

In this case, two detecting methods are proposed. First, relative multi-channel information is detected on a basis of correlation value of the field sync signal when the multi-channel does not exist by using only the field sync signal of the main signal (nFSYNC). In other words, the multi-channel power information is detected by a train sequence generator 801 for detecting train sequence from the field sync signal of the main signal, a multiplier 802-1 for multiplying the output signal and input signal of the train sequence generator 801, an integer extractor 803-1 for obtaining only integers from the output of the multiplier 802-1, and a ghost power formalizer 804 for calculating and formalizing ghost power from the output of the integer extractor 803-1 so as to detect the multi-channel power information.

Second, correlation value between the field sync signal of the main signal (nFSYNC) and the field sync signal of the multi-channel signals (gFSYNC) is calculated for finding the multi-channel information. In other words, the multi-channel information is found by using a train sequence generator 801 for generating train sequence of the main signal and of each multi-channel signal from the field sync signals of the main signal and the multi-channel signals (nFSYNC) (gFSYNC), number of multipliers (802-1, 802-2, . . . , 802-n) for multiplying the main and each multi-channel train sequence outputted from the train sequence generator 801 with an input signal, n number of integer extractors (803-1, 803-2, . . . , 803-n) for extracting only the integer from each output of the n number of multipliers (802-1, 802-2, . . . , 802-n), and a ghost power formalizer 804 for calculating and formalizing ghost power from the output of the n number of integer extractors (803-1, 803-2, . . . , 803-2).

Therefore, in the method of using tab coefficient or tab energy of a conventional convergence of the channel equalizer is precondition and the information detection is possible in only a limited environment. However, in the method of using the multi-channel information from a multi-channel signal power information calculator 202-1 proposed by the present invention, the by detecting the multi-channel information of the channel equalizer, the limitation is relieved.

Figure 9:
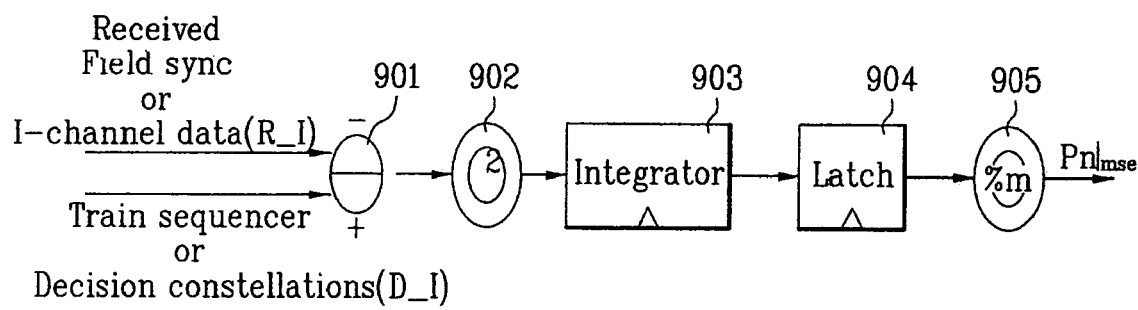
FIG. 9 illustrates a block diagram showing SNR information calculator of FIG. 3.

1-3) SNR Information Calculator:

FIG. 9 illustrates a block diagram showing SNR information calculator in FIG. 3. The following two methods are selectively used.

In a first method, that is a method of detecting error form field sync signal of demodulated receiving signal, an MSE (mean square error) value is calculated from the received field sync signal and the train sequence and the SNR is calculated by using the MSE value. In this method, data is renewed in each field through detecting the error from the field synchronized portion of the demodulated receiving signal. In this case, a subtractor 901 calculates difference between the received sync signal and the training sequence.

In a second method, the MSE value is calculated from demodulated and equalized I channel data (R_1) and decision constellation data (D_I), and the SNR is calculated from the MSE value. In other words, as a method of detecting error of the equalized I channel data and decision constellation value, data is renewed in each window of the accumulator. In this case, the subtractor 901 calculates the difference between the I channel data (R_1) and the decision constellation data (D_I), and outputs the calculation to the multiplier 902.

Then, the multiplier 902 multiplies the output of the subtractor 901 and outputs the calculation to the accumulator 903 for an accumulation. The accumulator 903 temporarily stores the accumulated signal through a latch 904 and outputs to a modulo-operator 905. The modulo-operator 905 counts the output of the latch 904 and resets the counted value to 0 whenever the value is m. In this instance, the m is a window size inputted to the accumulator 903.

The SNR is expressed in a following formula (1).

$$SNR = 10 \cdot \log(Ps/Pn) \qquad (1)$$

If, Ps is formalized as 1, $$Pn\big|_{mse} = \sum_{k=1}^{k=n}(mse/m).$$

In this case, mse=$(D\_I-R\_I)^2$, R_I is received constellations, D_I is decision constellations, m is a window size of the accumulator.

1-4) SER (Segment Error Rate)

The SER information calculator 204-1 receives the SER information from the VSB demodulator 102 and detects the Segment Error Rate. The SER information is reliable information and becomes a basis of final determination for antenna convergence result.

2) Antenna Direction Acquisition Controller:

The antenna acquisition controller 103-2 receives channel condition information (i.e., signal power condition, multi-channel power condition, SNR condition and SER condition) and signal power information from the channel information detector 103-1 and acquires the antenna direction.

Figure 10:
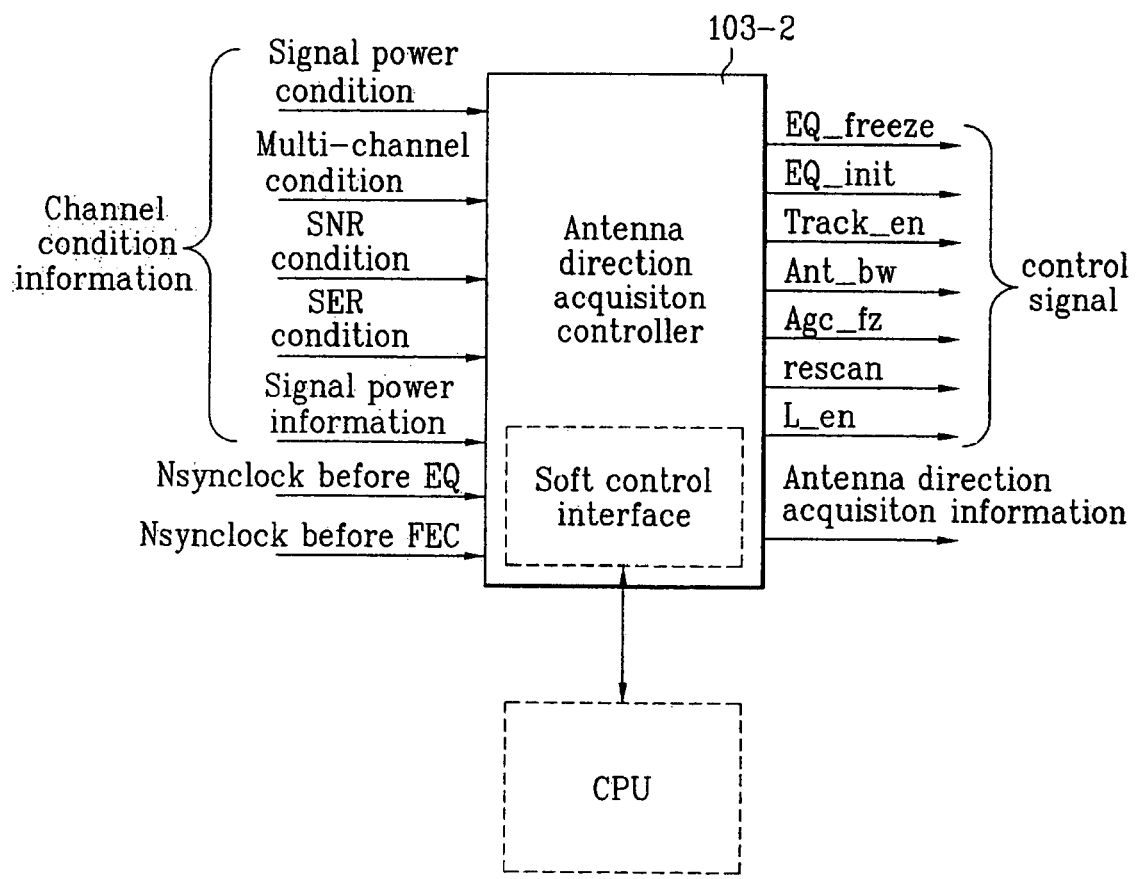
FIG. 10 illustrates a diagram showing an example of input/output signals of an antenna direction acquisition controller of FIG. 2.

FIG. 10 illustrates a diagram showing input/output signals of the antenna direction acquisition controller 103-2. In other words, as aforementioned, the input signal includes the channel condition information, signal power information, and SYNCLOCK signals (Nsynclock) before EQ and before FEC of the channel equalizer.

While the antenna scans, the output signal outputs an EQ_freeze control signal for suspending update of the channel coefficient, an EQ_freeze control signal for maintaining the early coefficient value by resetting when the channel equalizer is diverged, a track_en control signal for starting the antenna direction tracking process after the antenna acquisition process, an Ant_bw control signal for controlling a step size of the antenna direction by referring the channel condition information (i.e., SNR, SER), a rescan control signal for initializing the VSB demodulator 102 for reacquiring the antenna direction, an L_en signal for notifying each delayed time satisfied at the timer, and an antenna direction acquisition signal.

Figure 11:
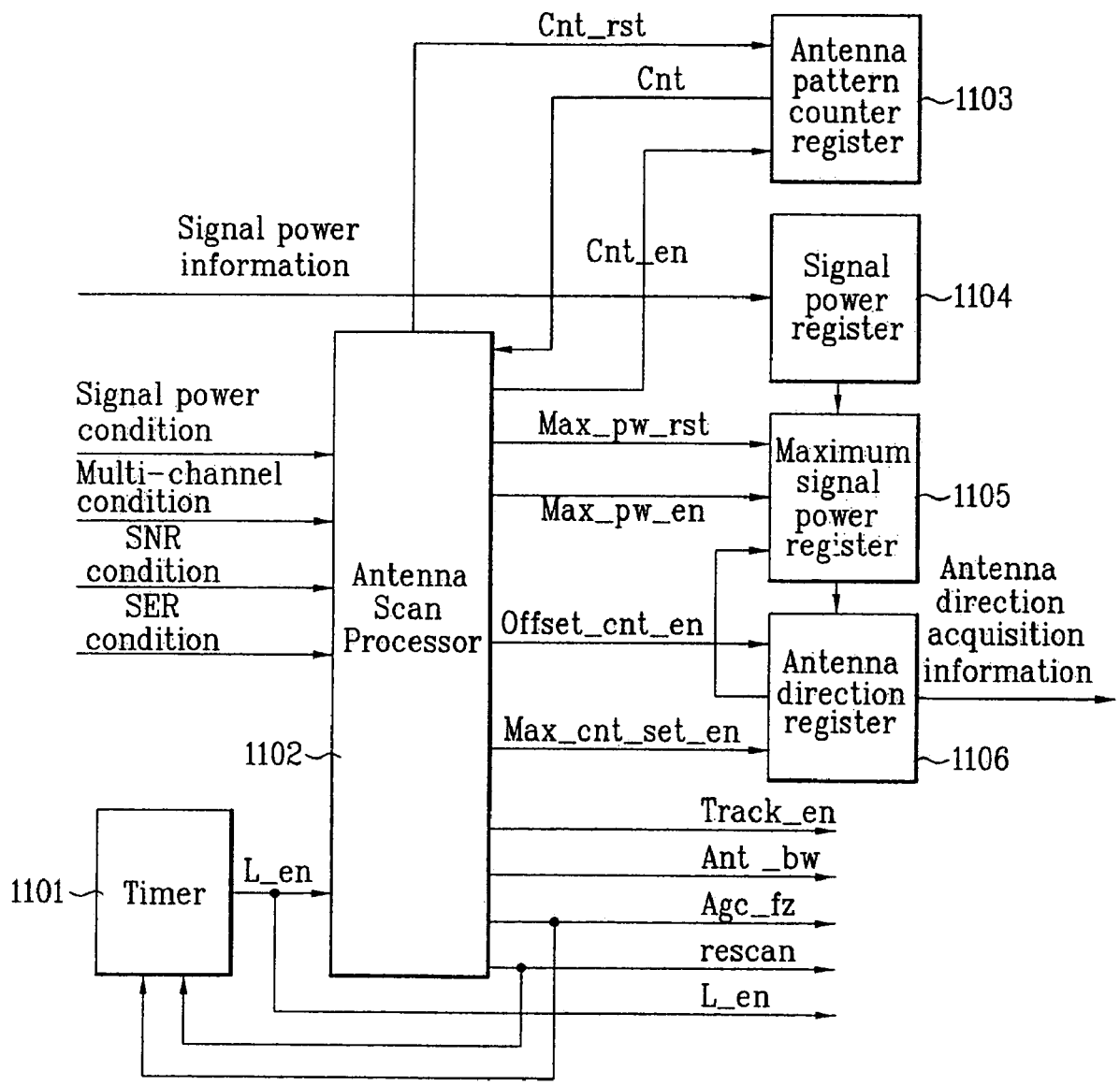
FIG. 11 illustrates a detailed block diagram of an antenna direction acquisition controller of FIG. 2.

FIG. 11 illustrates a detailed block diagram of an antenna direction acquisition controller in FIG. 2. As illustrated in FIG. 11, the antenna direction acquisition controller 103-2 includes an antenna scan processor 1102, a timer 1101, an antenna pattern counter register 1103, a signal power register 1104, a maximum signal power register 1105, and an antenna direction acquisition register 1106, and realized with hardware or software according to necessity. The structure has an advantage that flexibility of the system is largely increased. Function of the antenna direction acquisition controller 103-2 is schematically described as follows.

The antenna direction acquisition controller 103-2 detects the antenna direction of the maximum signal power by receiving the signal power information from the channel information detector 103-1 and transmits the information to the antenna direction tracking controller 103-3. The gain value of the auto gain controller of FIG. 4 is fixed as a specific value and the channel equalizer is stopped. After this, when the acquisition process is finished, the auto gain controller and the channel equalizer are normally operated.

The antenna direction controller 103-2 receives each SYNCLOCK signal (Nsynclock) from the before EQ and the before FEC of the channel equalizer, determines an initialization of the channel equalizer, watches and prevents the divergence of the channel equalizer because the channel equalizer may be diverged when the antenna is scanned. For example, it is viewed that the equalizer is diverged if the sync is found at the before the channel equalizer and not found at the before FEC for a predetermined time.

Figure 12:
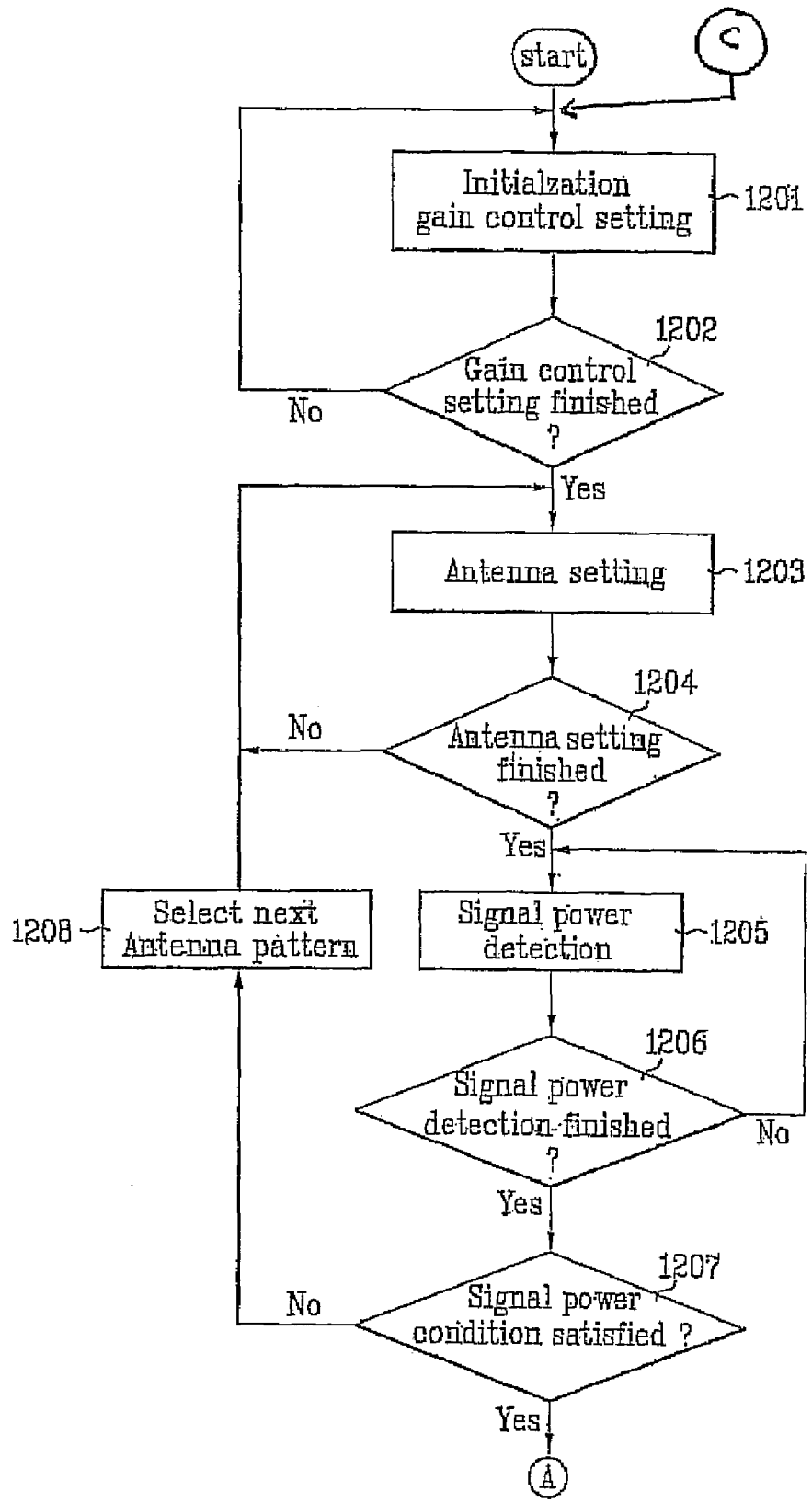
FIG. 12 illustrates a flow diagram of an antenna direction acquisition controller of FIG. 2.

Movement of the antenna direction acquisition controller 103-2 structured as mentioned above is described as follows. FIG. 12 illustrates a flow diagram showing a whole process of an antenna direction acquisition controller in FIG. 2.

1. The auto gain controller is fixed as a specific value (S1201–S1202).
2. The antenna direction is rotated to 360° and confirms whether the receiving signal exists (S1203–S1208).
3. The antenna is rotated to 360° from the direction of the receiving signal for acquiring the maximum signal power direction (S1209–S1214).
4. The antenna tracking process is started after acquiring the maximum signal power direction (S1215–S1219).
5. Reception is watched by reading the channel condition information (S1219).
6. When the receiving condition is bad, the reacquisition process is prepared and the process of the step 1 is repeated (S1220–S1221).

Hereinafter, the antenna direction acquisition controller 103-2 is described in more detail.

2-1) Registers:

The antenna pattern count register 1103 counts pattern number of the smart antenna acquired during the antenna acquisition process, the signal power register 1104 temporarily stores the signal power information, the maximum signal power register 1105 stores the maximum signal power value and the antenna direction, the antenna register 1106 stores the antenna direction information at the maximum signal power and outputs the antenna direction acquisition.

Figure 13:
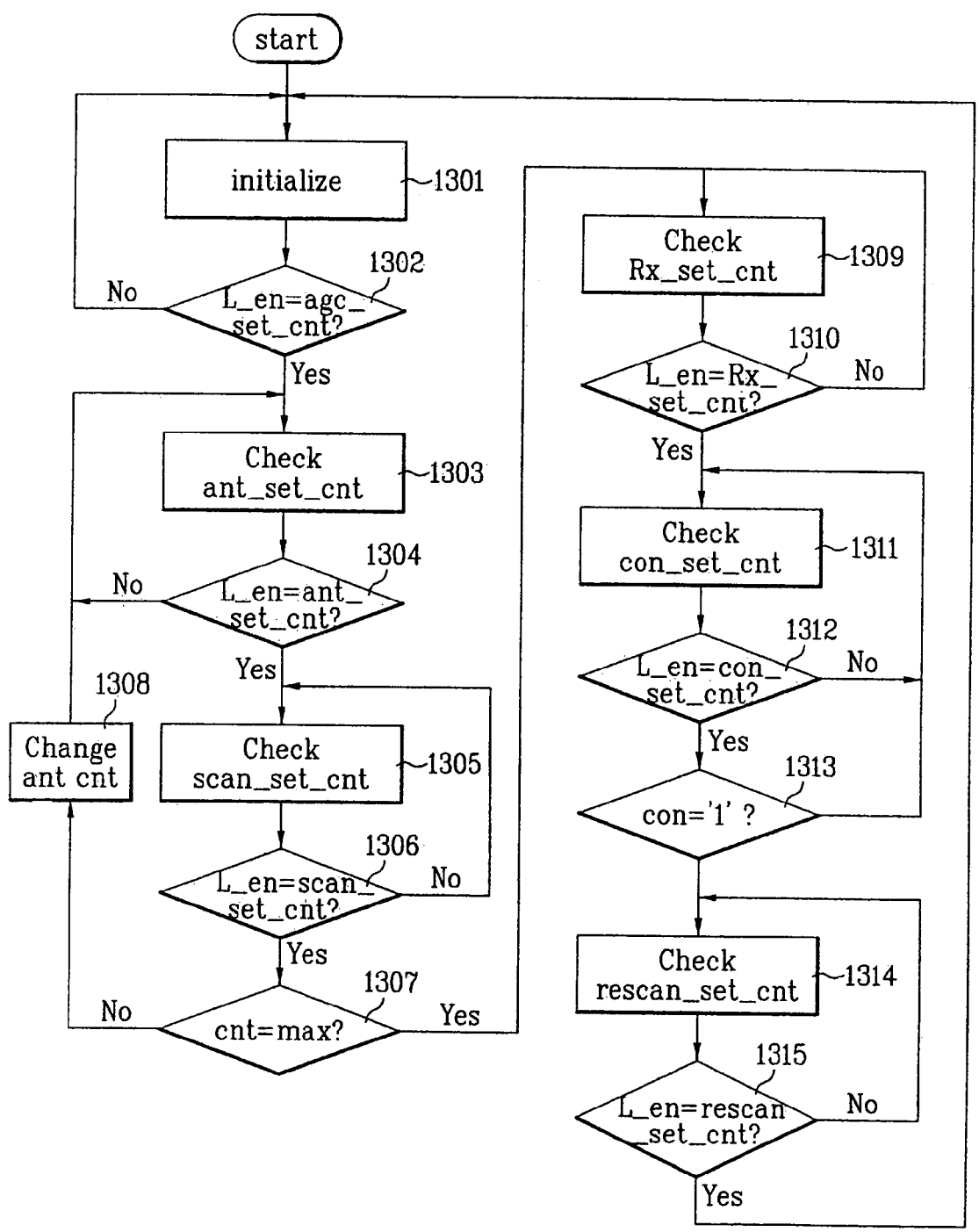
FIG. 13 illustrates a flow diagram of an example of a timer of FIG. 11.

2-2) Timer:

The timer 101 calculates the delay time of each the process of the scan processor 1102. In this case, the flow diagram calculating the delay time for each process is illustrated in FIG. 13. As illustrated in FIG. 13, the delay time being a variable determined by environment and condition is programmed at the timer 1101.

First, the variables being employed in FIG. 13 is defined as follows. Agc_set_cnt is a delay time for fixing the auto gain controller during the acquisition process, Ant_set_cnt is a delay time for setting the selected antenna pattern, Scan_set_cnt is a delay time for detecting the signal power from the input signal, Rx_set_cnt is a delay time of the receiver for converging, Con_set_cnt is a delay time for detecting the channel condition information, rescan_set_cnt is a delay time for reacquiring process, and L_en is a signal notified by the timer for notifying each delay time is satisfied when 1.

Hereinafter, the movement of the timer 110 will be described. First, the timer initializes the variables in FIG. 13 (S1301), upon the delay time (L_en=Agc_set_cnt) for fixing the auto gain control value during the acquisition process, checks the delay time for setting the currently selected antenna pattern (S1303–S1304), and checks the delay time for detecting the signal power inputted from the input signal (S1305–S1306), and then checks whether all the set antenna patterns are scanned (S1307). If the timer determines that all the set antenna directions are not scanned, the timer scans a next antenna direction (S1308) and returns to the step 1303 (S1303).

Meanwhile, if the timer determines that all the set antenna directions are not scanned, the timer checks time for recovering the system (S1309–S1310) and checks the delay time (Con_set_cnt) consumed for detecting the channel condition information. When the channel condition abovementioned is all satisfied (S1313), the timer checks the delay time (rescan_set_cnt) consumed for reacquiring process (S1314–S1315).

2-3) Antenna Scan Processor:

The antenna scan processor 1102 outputs control signals needed for the acquisition process by receiving the signal power information and the channel condition information (i.e., the signal power condition, multi signal power condition, SNR condition, and SER condition). In this case, the control signals of the scan processor 1102 in FIG. 14 to FIG. 7 are as follows.

First, as an internal control signal of the antenna scan processor 1102, (1) cnt_rst initializes the antenna pattern counter register 1103 when the cnt_rst is 1, (b) cnt is the antenna counter pattern value, (c) cnt_en allows counting of the antenna pattern counter register 1103 when the cnt_en is 1, (d) max_pw_rst initializes the maximum signal power when the max_pw_en is 1, (e) max_pw_en allows renew of the maximum signal power register value 1105 when max_pw_rst is 1, (f) offset_cnt_en allows renew of the antenna direction acquisition register value 1106, (g) max_cnt_en allows loading the maximum signal power antenna acquisition value from the maximum signal power register 1105 to the antenna direction acquisition register 1106 when the max_cnt_en is 1. In the mean time, as an external control signals of the antenna scan processor 1102, (h) track_en allows the antenna direction tracking process after finishing the antenna acquisition process when the track_en is 1, (i) ant_bw controls a step size of the antenna direction by looking at the channel condition information (i.e., SNR, SER), (j) agc_fz fixes the auto gain controller (AGC) in the process of the antenna direction process when the agc_fz is 1, (k) rescan initializes the VSB demodulator 102 for reacquiring the antenna direction when rescan is 1, (l) L_en is a signal for notifying that each delay time is satisfied at the timer 1101 when the L_en is 1.

Figure 14:
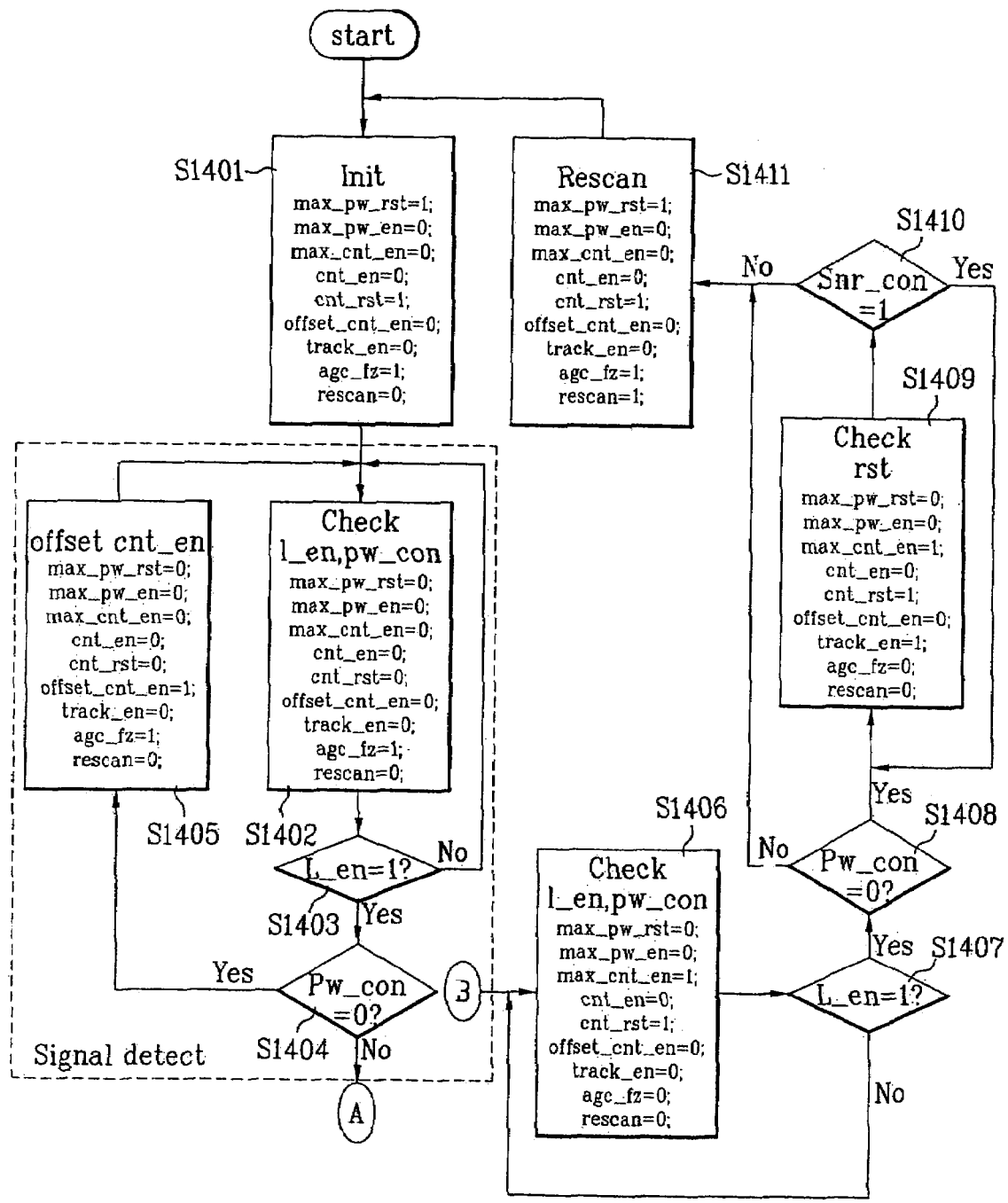
FIG. 14 and FIG. 15 illustrate a flow diagram of an antenna scan processor of FIG. 11.
Figure 15:
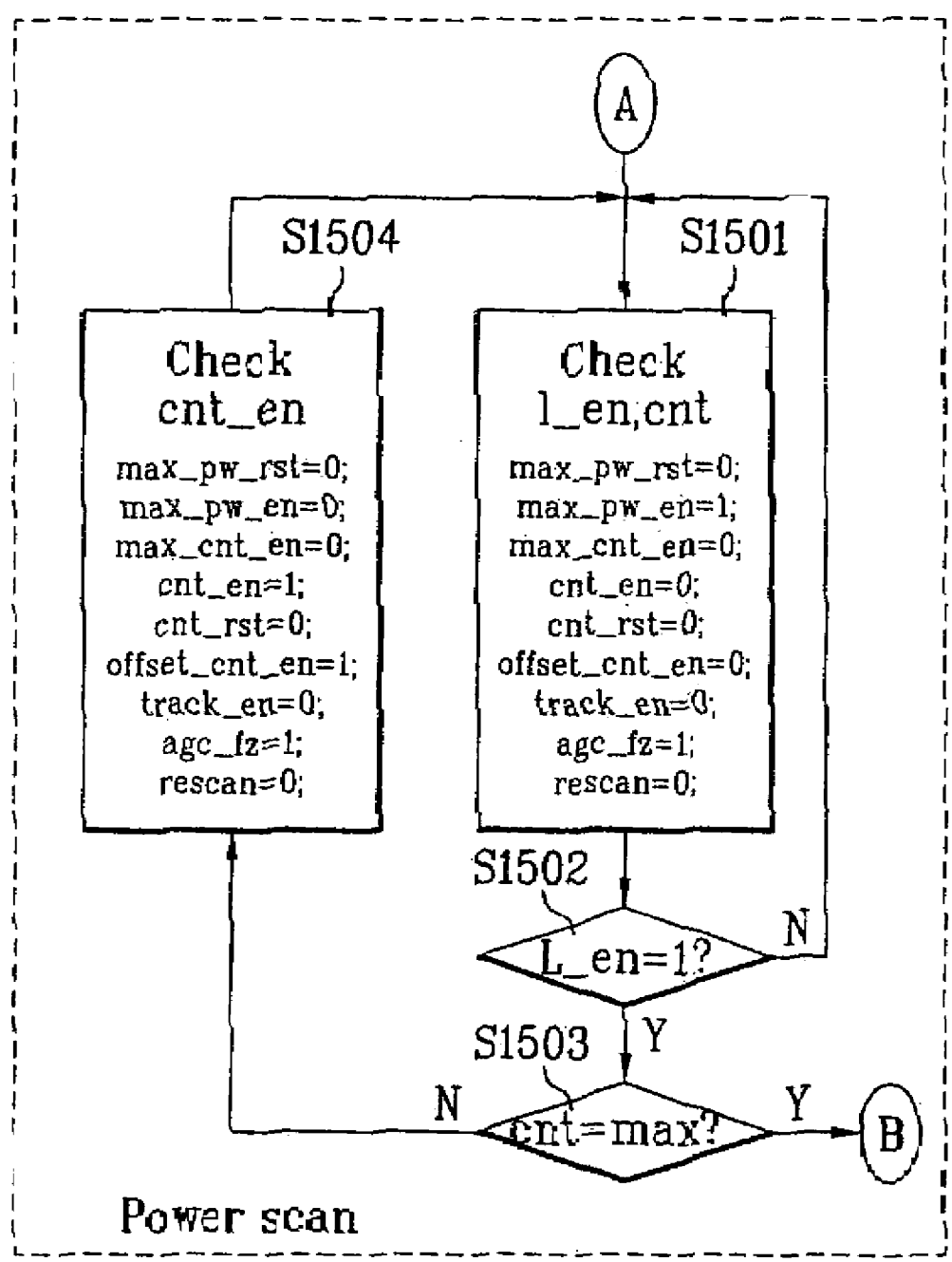

Based on the control signal abovementioned, movement of the antenna scan processor 1102 illustrated in FIG. 14 and FIG. 15 is described as follows.

First, the maximum signal power register 1105 and the antenna pattern counter register 1103 are initialized and the auto gain controller (AGC) is fixed as a specific value (S1401).

Second, the maximum signal power direction is acquired by rotating the antenna direction to 360° (S1501–S1504). In this case, the antenna pattern counter register 1103 and the antenna direction acquisition register 1106 are renewed. If all the antenna patterns are checked, the step 1406 is processed. (S1406). The auto gain controller is fixed at a specific value.

Fourth, the maximum signal power antenna direction acquisition value is loaded from the maximum signal power register 1105 to the antenna direction acquisition register 1106 and the antenna counter register 1103 is initialized (S1406).

Fifth, the antenna acquisition process is finished and the antenna direction tracking process is started (S1407–S1410). In this instance, the antenna pattern counter register 1103 is initialized. However, if the channel condition information (i.e., the signal power condition, SNR information condition) is not satisfied, the maximum signal power register 1105 is initialized and the VSB demodulator 102 is initialized for reacquiring the antenna direction and rescanned (S1411).

3) Antenna Direction Tracking Controller:

The antenna tracking controller 103-3 receives the channel information (i.e:, such as signal power, multi-channel signal power, SNR) from the channel information detector 103-1, converges the antenna direction from the maximum signal power acquisition location to the optimal receiving location. When the smart antenna provides only a very simple antenna pattern, for example, when having a plurality of antenna patterns, the tracking process is omitted.

However, when the antenna provides a tens of or hundreds of antenna patterns, effective receiving performance is improved, and the antenna enables to correspond to a channel environment changed every hour.

Figure 16:
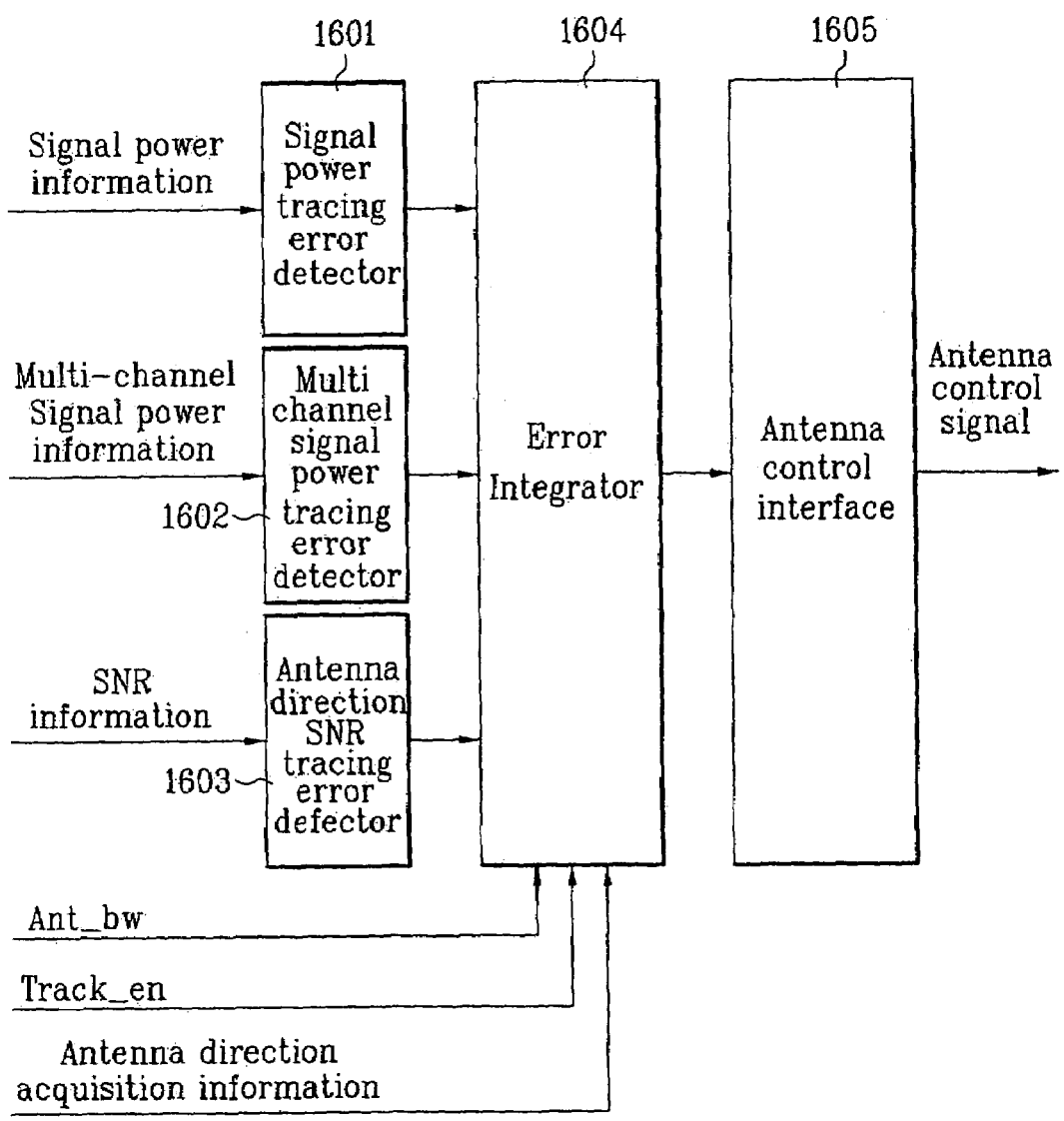
FIG. 16 illustrates a detailed block diagram of an antenna direction tracking controller of FIG. 2.

The antenna direction tracking controller 103-3, as illustrated in FIG. 16, includes a signal power tracking error detector 1601, a multi-channel power tracking error detector 1602, a SNR tracking error detector 1603, an error integrator 1604, and the antenna control interface 1605. Hereinafter, the antenna direction tracking controller 103-3 is described in more detail.

Figure 17:
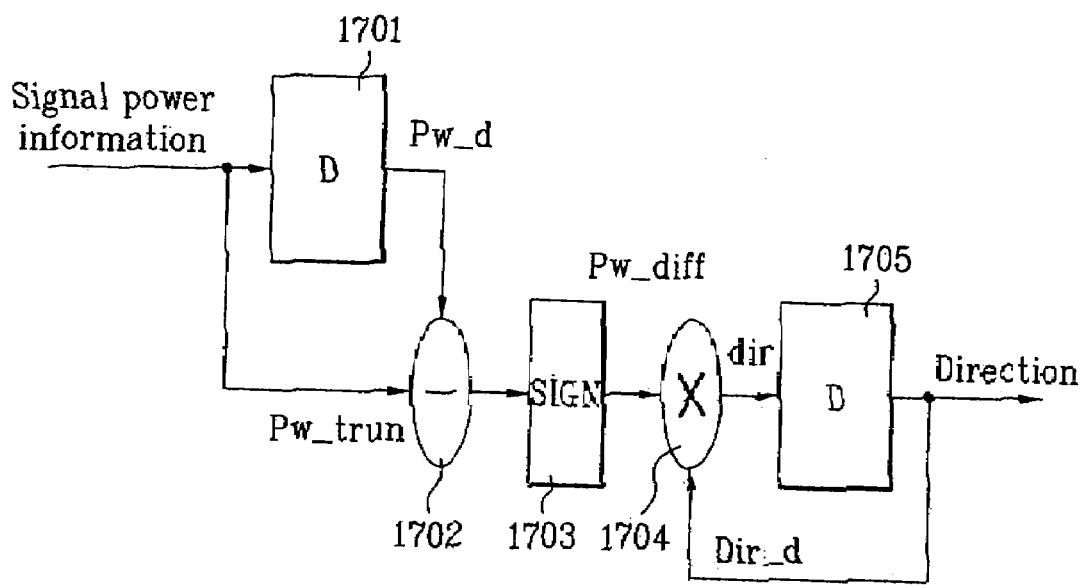
FIG. 17 illustrates a detailed block diagram of an antenna direction power tracking error detector of FIG. 16.

3-1) Signal Power Tracking Error Detector:

FIG. 17 illustrates a detailed block diagram of a signal power tracking error detector 1601. As illustrated in FIG. 17, the signal power tracking error detector . 1601 includes a delayer 1701 for comparing the present antenna convergence direction for the signal power information with the previous convergence direction, a subtractor 1702, a sign assignor 1703 for distinguishing the converged direction by adding a predetermined sign, and a multiplier 1704 and a delayer 1705 for outputting the antenna convergence direction according to the comparison result.

The signal power tracking error detector 1601 structured as abovementioned regularly receives the signal power information from the channel information detector 103-1 and outputs the antenna convergence direction by the change of signal power information according to a change of the antenna direction.

For example, if the signal power is increased when the antenna convergence direction is moved clockwise, the antenna convergence direction is moved one more step clockwise. If the signal power is decreased, the antenna convergence direction is moved counterclockwise. By repeating said process, the antenna convergence direction information is outputted to the error integrator 1604.

Figure 18:
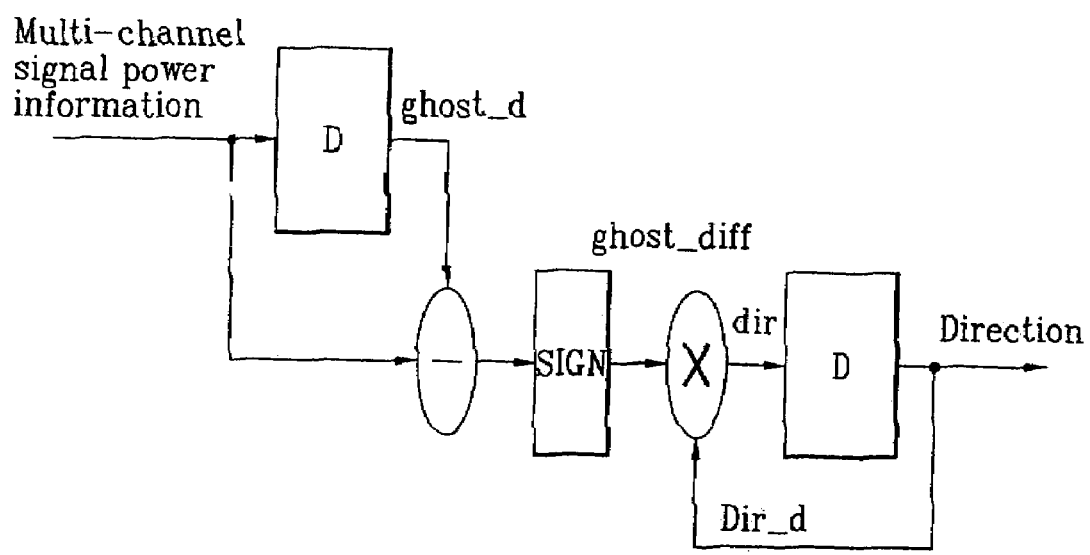
FIG. 18 illustrates a detailed block diagram of an antenna direction multi-channel power tracking error detector of FIG. 16.

3-2) Multi-Channel Signal Power Tracking Error Detector:

FIG. 18 illustrates a detailed block diagram of an antenna direction multi-channel signal power tracking error detector 1602 of which the structure is similar to the structure of FIG. 17 and will be omitted. The multi-channel signal power tracking error detector 1602 regularly receives SNR information from the channel information detector 103-1, watches the change of the multi-channel signal power information according to the antenna direction change, and outputs the antenna convergence direction.

For example, if the signal power is increased when the antenna convergence direction is moved clockwise, the antenna convergence direction is moved one more step clockwise. If the signal power is decreased, the antenna convergence direction is moved counterclockwise. By repeating said process, the antenna convergence direction information is outputted to the error integrator 1604.

Figure 19:
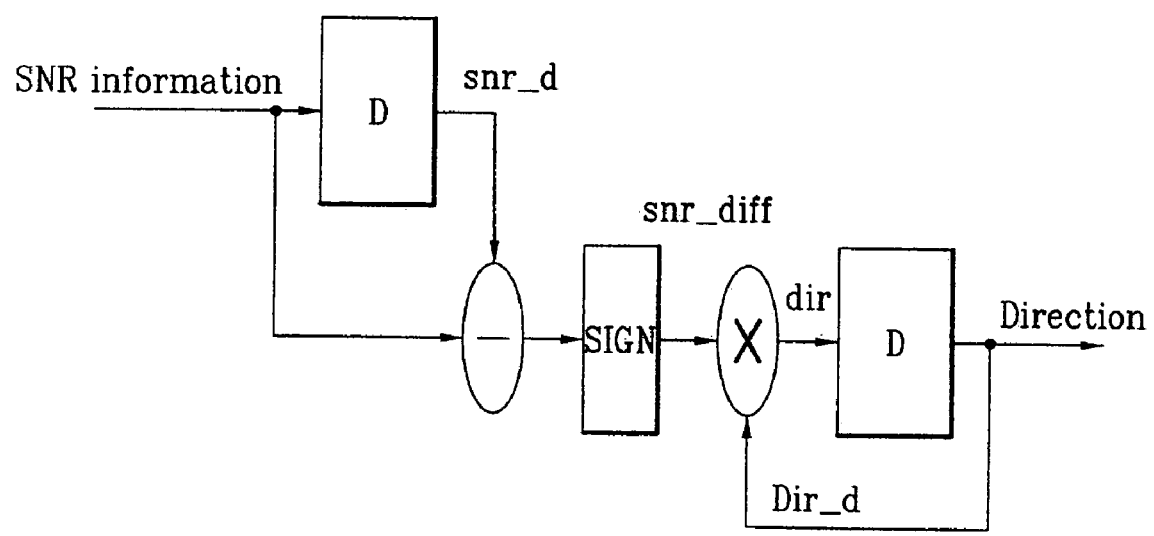
FIG. 19 illustrates a detailed block diagram of an antenna direction SNR tracking error detector of FIG. 16.

Examples of many tracking error detectors are illustrated in FIG. 17 to FIG. 19, and various tracking error detectors to be proposed in the present invention may be applied. Antenna convergence information of a plurality of antenna tracking error detector are selectively assembled and employed in the antenna tracking process.

Figure 20:
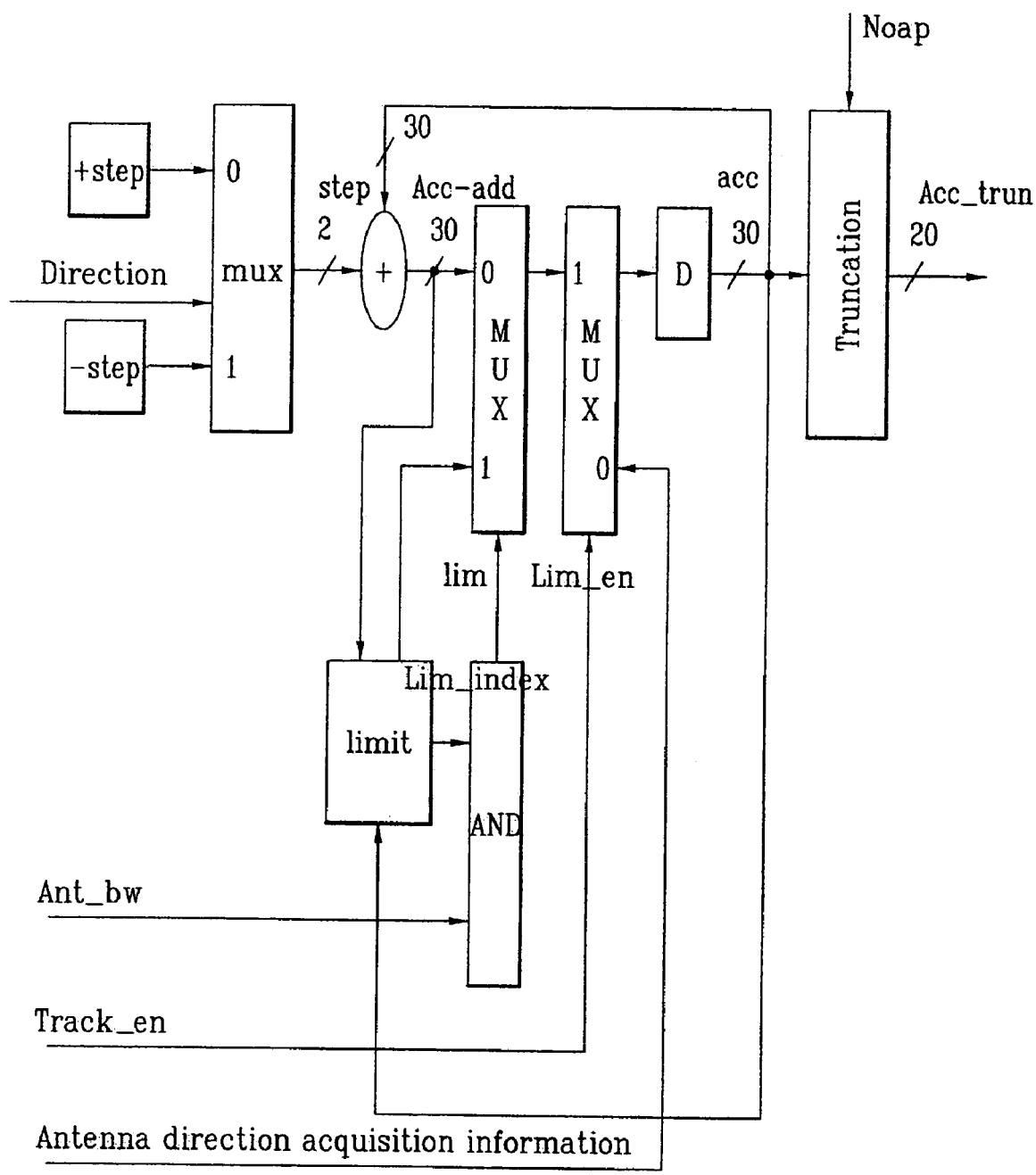
FIG. 20 illustrates a detailed block diagram of an error integrator of FIG. 16.

3-4) Error Integrator:

FIG. 20 illustrates a detailed block diagram showing an embodiment of an error integrator 1604. The error integrator 1604 accumulates errors by receiving and selectively assembling the antenna convergence information from each tracking error detector 1601–1603. The accumulated error is converged into an optimal antenna direction around the antenna direction of maximum signal power acquisition location.

Top value of the error accumulated at the error integrator 1604 is divided into number of antenna patterns, and converged into the antenna direction. Detailed movement of the error integrator 1604 is as follows. In an antenna direction acquisition process (i.e., when track_en is 0), the signal power acquisition direction is loaded from the antenna direction acquisition controller 103-2 and in an antenna tracking process (i.e., track_en is 1), the antenna convergence direction information is accumulated. In this case, the antenna convergence range is limited according to the reception (i.e., SNR or SER condition). For example, if the reception is not satisfied after the antenna direction acquisition process, the antenna acquisition range is deviated from the adjacent antenna direction acquisition. If the reception is satisfied, the antenna acquisition convergence range is limited within the antenna direction acquisition location. Purpose of the limitation is for preventing the antenna control system from being diverged.

Noap being number of the antenna patterns means a step size of the antenna direction. The antenna step size is controlled according to the antenna direction convergence. In general, in an early convergence process, the step size is enlarged for a fast convergence and decreased at an optimal convergence location for stabilizing the signal change resulted form the tracking process.

3-5) Antenna Control Interface

Antenna control interface 1605 means an interface between an antenna control system and a smart control system. The present invention basically supports US CEA/EIA 909 standard (a series data transmission) and other various interfaces may be supported. The antenna interface changes according to a kind of the smart antenna.

Meanwhile, the present invention can be applied to an antenna system in a filed of radio telecommunication such as VSB/OFDM.

As abovementioned, the digital TV receiving antenna control system has advantages as follows.

First, a process for controlling the smart antenna is divided into an acquisition process and a tracking process, and the tracking process is selectively omitted and applied to both a simple and complex smart antenna.

Second, in the acquisition process, the maximum signal power direction is detected by fixing AGC as a specific value. In other words, a method of indirectly detecting a signal size from the AGC information of the tuner was conventionally used. However, in the present invention, a method of directly calculating the signal power from an input signal is employed and the method is highly reliable and the detecting speed is very fast.

Third, the antenna controller of the present invention not only achieves optimal antenna convergence but also corresponds to a channel environment changed every hour by selectively assembling various channel information and using the information in the tracking process.

Fourth, it is easy to make in one-chip and integration of the system is improved because all controlling portions may be digital and flexibility of the control system is secured because the antenna scan process includes software.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A smart antenna control system, comprising:
    a smart antenna system for forming an antenna pattern suitable for signal reception by receiving mechanical or electrical antenna control signal and controlling a beam width, gain, and frequency characteristic;
    a VSB demodulator for generating channel data for demodulating a VSB (Vestigial Side Band) signal received through the smart antenna system, generating channel data for the antenna pattern, and outputting the demodulated VSB signal in a transport packet form; and
    an antenna controller for receiving the channel data and auto gain control information from the VSB demodulator and controlling the smart antenna system by using the auto gain control information and the channel information,
    wherein the antenna controller is adapted to acquire a maximum signal power by calculating signal power using a fixed specific value of the auto gain control information and detecting the maximum signal power.

2. The digital TV receiving smart antenna control system of claim 1, wherein the channel data comprises the auto gain control information, demodulated I channel data, phase-tracked I channel data, FEC (forward error correction) error data, and a field sync signal.

3. The digital TV receiving smart antenna control system of claim 1, wherein the VSB demodulator comprises an auto gain controller for directly controlling a gain of RF (Radio Frequency) and a gain of IF (Intermediate Frequency) signal.

4. The digital IV receiving smart antenna control system of claim 3, wherein the auto gain controller comprises:
    a tuner for tuning the gain of the RF signal by increasing or decreasing the gain of RF signal according to inputted RF auto gain control signal;
    an IF auto gain controller for controlling the gain of the IF signal by increasing or decreasing the gain of IF signal according to inputted IF auto gain control signal;
    a VSB receiving chip for generating the IF auto gain control signal and the RF auto gain control signal by using a reference value of a RF auto gain control signal and demodulated passband or baseband receiving signal, and outputting the signals to the IF auto gain controller and the tuner.

5. The digital TV receiving smart antenna control system of claim 1, wherein the antenna controller comprises:
    a channel information detector for receiving the channel data from the VSB demodulator and detecting the channel information so as to determine a predetermined channel condition;
    an antenna direction acquisition controller for receiving the channel information and the channel condition information and acquiring the antenna direction;
    an antenna direction tracking controller for receiving an acquisition signal of the antenna direction acquisition controller and the channel information and converging the antenna direction from a maximum signal power acquisition location to an optimal receiving location.

6. The digital TV receiving smart antenna control system of claim 5, wherein the channel information detector comprises:
    a signal power detector for detecting and outputting the signal power information from I signal of the passband or baseband signal, the IF gain, and RF gain in the channel data, and comparing the signal power information with a preset signal power reference value so as to output the signal power condition;
    a multi-channel signal power detector for detecting and outputting the multi-channel signal power information from an equalizer input I channel data or a field sync signal in the channel data, and comparing the multi-channel signal power information with the preset multi-channel signal power reference value so as to output the multi-channel signal power condition;
    a SNR detector for detecting SNR (signal-to-noise) information from FEC (forward error correction) input I channel data or field sync signal in the channel data, and comparing the SNR information with a preset SNR reference value so as to output SNR condition; and
    a SER detector for detecting and outputting SER (segment error rate) information from FEC error value in the channel data, and comparing the SER information with preset SER reference value so as to output SER condition.

7. The digital TV receiving smart antenna control system of claim 6, wherein the signal power detector receives and squares the passband or baseband I signal, accumulates the squared value into a predetermined window size, and detects and outputs the signal power information.

8. The digital TV receiving smart antenna control system of claim 6, wherein signal power detector receives the passband or baseband I signal and get an absolute value, accumulates the absolute value into a predetermined window size, and detects and outputs the signal power information.

9. The digital TV receiving smart antenna control system of claim 6, wherein the multi-channel signal power detector comprises:
    a train sequence generator for detecting a train sequence from the field sync signal (nFSYNC) of a main signal;
    a multiplier for multiplying an output of the train sequence generator with an input signal;
    an integer extractor for extracting an integer from an output of the multiplier;
    a ghost power formalizer for formalizing and calculating ghost power from the integer extractor.

10. The digital TV receiving smart antenna control system of claim 6, wherein the multi-channel signal power detector comprises:
    a train sequence generator for generating a train sequence of a main signal and each multi-channel signal;
    a plurality of multipliers for multiplying the train sequence of the main and each multi-channel with the input signal;
    an integer extractor for extracting only an integer from each output of the plurality of multiplier; and
    a ghost power formalizer for formalizing and calculating ghost power from the integer extractor.

11. The digital TV receiving smart antenna control system of claim 6, wherein the SNR detector calculates the a MSE (mean square error) value from the received field sync signal and train sequence, and finding and outputting SNR information by using MSE value.

12. The digital TV receiving smart antenna control system of claim 6, wherein the SNR detector calculates MSE value from demodulated and equalized I channel data and decision constellation and obtaining and outputting SNR information by using MSE value.

13. The digital TV receiving smart antenna control system of claim 6, wherein the antenna direction acquisition controller continuously determines whether to perform an antenna direction tracking process by selectively assembling channel condition information outputted from the channel information detector or to repeat an antenna direction reacquisition process, and receives SYNCLOCK signals before EQ and before FEC and determines an initialization of the channel equalization.

14. The digital TV receiving smart antenna control system of claim 6, wherein antenna direction acquisition controller rotates the antenna direction 360° for confirming whether a receiving signal exists by controlling the smart antenna system, and rotates the antenna 360° from the antenna direction having the receiving signal for acquiring the maximum signal power direction so as to start an antenna tracking process.

15. The digital TV receiving smart antenna control system of claim 6, wherein the antenna direction acquisition controller comprises:
    an antenna scan processor for receiving the signal power channel condition information from the channel information detector and outputting necessary control signals;
    a timer for calculating delay time in each process of the antenna scan processor;
    an antenna pattern count register for counting pattern number of the smart antenna in an antenna direction acquisition process;
    a signal power register for storing the signal power information;
    a maximum signal power register for storing the maximum signal power value and the antenna direction; and
    an antenna direction register for storing the antenna direction information.

16. The digital TV receiving smart antenna control system of claim 4, wherein the antenna direction tracking controller comprises:
    a signal power tracking error detector for regularly receiving the signal power information from the channel information detector, and outputting the antenna convergence direction by observing a signal power change according to the antenna direction change;
    a multi-channel signal power tracking error detector for regularly receiving the multi-channel signal power information from the channel information detector, and outputting the antenna convergence direction by observing a multi-channel signal power change according to the antenna direction change;
    a SNR tracking error detector for regularly receiving SNR information from the channel information detector and outputting the antenna convergence direction by observing a multi-channel signal power change according to the antenna direction change; and
    an error integrator for accumulating errors by selectively assembling the antenna convergence information of the tracking error detector, and outputting the antenna control signal so as to converge the accumulated error to an optimal antenna direction around the antenna direction of the maximum signal power acquisition location.

17. A digital TV receiving smart antenna control system, comprising:
    the smart antenna system forming an optimal antenna pattern for a signal reception by controlling the antenna through an antenna control signal;
    a tuner for tuning only a specific RF signal in RF (Radio Frequency) signal received through a smart antenna system, and converting the signal into an IF signal after automatically controlling RF gain tuned according to RF gain control signal;
    a VSB (Vestigial Side Band) demodulator for demodulating after controlling the IF (intermediate Frequency) signal gain according to IF gain control signal;
    a channel information detector for detecting channel information such as signal power, multi-channel signal power, SNR (signal-to-noise ratio), and SER (Segment Error Rate) outputted from the VSB demodulator, determining the channel condition and outputting the channel information and the channel conditions; and
    an antenna direction acquisition controller for receiving signal power condition, multi-channel signal power condition, SNR condition, SER condition, and signal power information form the channel information detector and detecting and outputting an antenna direction of the maximum signal power, fixing the RF gain control signal and IF gain control signal in acquisition process, and changing the signals according to the receiving signal in a tracking process.

18. The digital TV receiving smart antenna control system of claim 17, wherein the channel information detector comprises:
    a signal power detector for receiving passband and baseband I signal from the VSB demodulator, detecting the signal power information, and comparing the signal power information with the signal power reference value so as to output the power condition;
    a multi-channel signal power detector for receiving I channel data or a field sync signal equalized at the VSB demodulator, detecting multi-channel signal power information, and comparing the multi-channel signal power information with a preset multi-channel signal power reference value so as to output the multi-channel signal power condition;
    a SNR detector for receiving I data or field sync signal detecting SNR (signal-to-noise) information from FEC (forward error correction) input I channel data or field sync signal in the channel data, and comparing the SNR information with a preset SNR reference value so as to output SNR condition; and
    a SER detector for detecting and outputting SER (segment error rate) information from FEC error value in the channel data, and comparing the SER information with preset SER reference value so as to output SER condition.

19. The digital TV receiving smart antenna control system of claim 18, wherein the signal power detector comprises:
    a squaring operator for receiving passband and baseband I signal from the VSB demodulator; and
    an integrator for accumulating the squared value in a predetermined window size and detecting the signal power.

20. The digital TV receiving smart antenna control system of claim 18, wherein the signal power detector comprises:

an absolute operator for receiving the passband and baseband I signal from the VSB demodulator; and an integrator for accumulating the absolute value in a predetermined window size and detecting the signal power.

21. The digital TV receiving smart antenna control system of claim 18, wherein the multi-channel signal power detector detects the multi-channel power information based on a correlation value of the field sync section when the multi-channel does not exist by using the field sync section of a main signal.

22. The digital TV receiving smart antenna control system of claim 18, wherein the multi-channel signal power information detector detects the correlation value by using field section of a primary multi-channel signals and a field section of the main signal, and detecting the multi-channel power information.

23. The digital TV receiving smart antenna control system of claim 18, wherein the SNR detector squares difference of the field sync signal and training sequence included in demodulated receiving signal, accumulates the calculation, and calculates an average to obtain MSE so as to apply the MSE value and detect SNR.

24. The digital TV receiving smart antenna control system of claim 18, wherein the SNR detector calculates MSE of received signal by squaring difference between the demodulated receiving signal and decision constellation, accumulates the calculation, detects SNR by applying the MSE value.

25. The digital TV receiving smart antenna control system of claim 18, wherein the antenna direction acquisition controller determines whether to perform an antenna direction tracking process by selectively assembling the signal power information, multi-channel signal power condition information, SNR condition information, and SER condition information outputted from the channel information detector or to repeat an antenna direction reacquisition process, and receives SNCLOCK signals before EQ and before FEC, and determines an initialization of the channel equalization.

26. The digital TV receiving smart antenna control system of claim 17, wherein the antenna acquisition controller confirms whether the receiving signal exists by controlling the smart antenna system and rotating the antenna direction, and acquires the maximum signal power direction by rotating the antenna 360° from the antenna direction having the receiving signal so as to start an antenna tracking process.

27. The digital TV receiving smart antenna control system of claim 17, wherein the antenna direction acquisition controller comprises:

an antenna scan processor for receiving the signal power channel condition information from the channel information detector and outputting necessary control signals;

a timer for calculating delay time in each process of the antenna scan processor;

an antenna pattern count register for counting pattern number of the smart antenna in an antenna direction acquisition process;

a signal power register for storing the signal power information;

a maximum signal power register for storing the maximum signal power value and the antenna direction; and an antenna direction register for storing the antenna direction information.

28. The digital TV receiving smart antenna control system of claim 17, further comprising an antenna direction tracking controller for receiving signal power information, multi-channel signal power information, SNR information from the channel information detector, generating an antenna control signal, outputting the signal to the smart antenna system, and converging the antenna direction from the maximum signal power acquisition location to the optimal receiving location.

29. The digital TV receiving smart antenna control system of claim 28, wherein the antenna direction tracking controller comprises:

a signal power tracking error detector for regularly receiving the signal power information from the channel information detector, and outputting the antenna convergence direction by observing a signal power change according to the antenna direction change;

a multi-channel signal power tracking error detector for regularly receiving the multi-channel signal power information from the channel information detector, and outputting the antenna convergence direction by observing a multi-channel signal power change according to the antenna direction change;

a SNR tracking error detector for regularly receiving SNR information from the channel information detector and outputting the antenna convergence direction by observing a multi-channel signal power change according to the antenna direction change; and an error integrator for accumulating errors by selectively assembling the antenna convergence information of the tracking error detector, and outputting the antenna control signal so as to converge the accumulated error to an optimal antenna direction around the antenna direction of the maximum signal power acquisition location.

30. The digital TV receiving smart antenna control system of claim 28, wherein the top value of an error accumulated to the error integrator is divided and converged into the antenna direction.

31. A method for controlling a digital TV receiving smart antenna, comprising the steps of:

(a) acquiring maximum signal power according to the antenna direction by using signal power information, multi-channel information, SNR information, and SER information extracted from an input signal; and (b) converging the smart antenna into an optimal reception by selectively assembling the signal power information, the multi-channel information, the SNR information, and the SER information, wherein the maximum signal power is acquired by calculating a signal power using a fixed specific value of auto gain control and detecting the maximum signal power.

32. The method for controlling a digital TV receiving smart antenna of claim 31, wherein the step (a) comprises:

(c) fixing the auto gain control value as a specific value;

(d) confirming whether the receiving signal exists by rotating the antenna direction;

(e) acquiring the maximum signal power direction by rotating the antenna 360° from a direction of the receiving signal; and (f) directing antenna tracking after acquiring the maximum signal power direction.

33. The method for controlling a digital TV receiving smart antenna of claim 31, further comprising the steps of:

(g) determining whether the reception is good by referring to the channel condition information; and (h) starting a reacquisition process if the reception is not good.

* * * * *